United States Patent [19]

Limberg

[11] Patent Number: 5,675,332

[45] Date of Patent: Oct. 7, 1997

[54] PLURAL-STEP CHUNK-AT-A-TIME DECODER FOR VARIABLE-LENGTH CODES OF HUFFMAN TYPE

[75] Inventor: Allen LeRoy Limberg, Vienna, Va.

[73] Assignee: Samsung Electronics Co., Ltd., Kyungki-do, Rep. of Korea

[21] Appl. No.: 595,580

[22] Filed: Feb. 1, 1996

[51] Int. Cl.[6] .................................................. H03M 7/40
[52] U.S. Cl. .................................................. 341/67; 341/65
[58] Field of Search .......................... 341/67, 65; 395/410, 395/412, 416

[56] References Cited

U.S. PATENT DOCUMENTS

| | | | |
|---|---|---|---|
| 4,899,149 | 2/1990 | Kahan | 341/67 |
| 5,032,838 | 7/1991 | Murayama et al. | 341/67 |
| 5,325,092 | 6/1994 | Allen et al. | 341/65 |
| 5,394,144 | 2/1995 | Kim | 341/67 |
| 5,600,812 | 2/1997 | Park | 395/410 |

OTHER PUBLICATIONS

S.B. Choi & M.H. Lee, "High Speed Pattern Matching for a Fast Huffman Decoder", *IEEE Transactions on Consumer Electronics*, vol. 41, No. 1, Feb. 1995, pp. 97–103.

R. Hashemian, "Memory Efficient and High–Speed Search Huffman Coding", *IEEE Transactions on Communications*, vol. 43, No. 10 Oct. 1995, pp. 2576–2581.

*Primary Examiner*—Brian K. Young
*Attorney, Agent, or Firm*—Sughrue, Mion, Zinn, Macpeak and Seas

[57] ABSTRACT

All except possibly the shortest code words in variable-length coding of Huffman type supplied in a codestream having data segments in which each successive code word comprises a pointer code segment followed by a target code segment are decoded in a plurality of successive steps, a plural-bit chunk each step.. Selection circuitry successively selects chunks of the pointer code segment and the target code segment of each codeword, determining the beginning of the pointer code segment of a first of the codewords responsive to a start of data segment command. The beginning of the pointer code segment of each further codeword is determined responsive to the accumulated bit-lengths of the complete codewords processed by the decoder since the start of data segment command, and the beginning of the target code segment of each codeword is determined with respect to the beginning of the pointer code segment of that same codeword by an indication of the bit-length of the pointer code segment of that same codeword. First partial memory addresses are generated responsive to the bit-lengths of the pointer code segments as successively selected by the selection circuitry. Each of the first partial memory addresses is temporarily stored until the selection circuitry successively selects the target code segment next after the one of the pointer code segments responsive to which the temporarily stored first partial memory address was generated, at least a portion of which target code segment is used as a second partial memory address. First memory addressed by the first and second partial addresses stores look-up tables of decoder output signal.

38 Claims, 10 Drawing Sheets

PLURAL-STEP CHUNK-AT-A-TIME DECODER FOR VARIABLE-LENGTH CODES OF HUFFMAN TYPE

The invention relates to look-up table decoders for variable-length coding (such as Huffman coding) that comprises concatenated variable-length codes, most species of which codes can each be analyzed as being composed of a pointer subcode of variable bit-length and a target subcode of fixed bit-length, the target subcodes being relatively efficiently encoded and the pointer subcodes being relatively inefficiently encoded; and, more particularly, the invention relates to look-up table decoders in which longer variable-length codewords are each analyzed a plural-bit chunk at a time in a respective series of steps.

BACKGROUND OF THE INVENTION

In image compression algorithms such as MPEG, JPEG, pX64(H.261) and the like, established as international standards for multimedia, frames of digitized imagedependent signal data-compressed by removing image redundancies are subjected to a block transform called discrete cosine transform (DCT). Further data-compression is achieved by entropy encoding of the quantized discrete cosine transform (DCT) of each image block, in which entropy encoding variable-length codes (VLC) descriptive of components of the DCT are selected from a coding table arranged according to the respective statistical characteristics of these components—i.e., the frequency in which various values of that DCT component are likely to occur for encoding. This is a lossless coding process separate from the quantization process. Entropy codes include the Huffman, arithmetic and universal codes. The DCT is encoded using variable-length-coding (VLC) such as Huffman coding. Each DCT block is expressed as a DC coefficient and a group of AC coefficients, the DC coefficients usually being encoded differently from the AC coefficients. Since generally the DC coefficient of each block has a high correlation with the DC coefficients of peripheral blocks, the usual procedure for coding the DC coefficient of each block is to determine its difference from the DC coefficient of the previously encoded block, which difference is then Huffman encoded to generate a one-dimensional variable-length code. The difference of the DC coefficient of the block to be initially encoded is usually determined by subtracting therefrom the median value of the available range for DC coefficients. The Huffman coding of the differential DC coefficient is done according to a code look up table selected in accordance with factors such as the type of image frame being coded. Also, the AC coefficients are converted from a multi-dimensional vector into one dimension by zigzag scanning. Replacing AC coefficients less than a threshold value with zeroes and ignoring trailing zero coefficients results in data compression, owing to the higher probability that the AC coefficient value is not "0" near the DC coefficient but is "0" far from the DC coefficient in DCT region. Then, the run lengths of consecutive "0" coefficients and the values of coefficients not "0" are expressed in two dimensions, that is, zero-run and level, respectively. For example, the DCT coefficient arrangement, such as 30, 2, 0, 0, −8, 0, 0, 0, 9, . . . which is achieved through zigzag scanning, is expressed as (0,30), (0,2), (2,−8) and (3,9) through the zero-run and level encoding. The zero-run and level symbols are converted to variable-length-coding (VLC) using Huffman coding according to one of second through $N^{th}$ code look up tables, N being an integer. The code look-up table that is used is selected by a classifier for the AC coefficients, which classifier may operate in dependence on the zero-run and level symbols for the DCT block.

The Huffman coding strings follow prefix codes that signal the starts of the Huffman codes. The Huffman coding strings and their prefix codes follow an image header code that contains coded information concerning the number and type of image frame described by the following code, the position in the frame of the image blocks generating the DCT blocks being coded and the identification of the code tables used during Huffman coding. In a multimedia system the image header code is usually part of a packet header code containing a use or routing code identifying the use to which a following packet of code will be put. The complete coded description of the image comprising the components described above is transmitted by the transmitting end of the system.

At the receiving end of the multimedia system, the use or routing code in the packet header code is detected to route the packet to the image reproducing equipment, in which equipment the use or routing code enables the detection of the image header codes and the prefix codes by a host processsor including coders designed for such decoding. Thereafter, a Huffman decoder is used to decode the variable-length Huffman code strings. The detection of the prefix codes provides start signals to be used to start the parsing of Huffman code strings by the Huffman decoder, and the detection of appropriate portions of the image header supplies lookup table selection codes for use by the Huffman decoder. The conventional Huffman decoders for multimedia either utilize tree searching or utilize a look-up table (LUT) stored in read-only memory (ROM) to decode the variable-length decoding. The decoding can be such as to convert the variable-length code to fixed-length code descriptions of DCT coefficients, for example. The variable-length code input for one fixed-length output word is generally composed of no more than 24 bits. Theoretically, the length of an input string for a fixed-length output word of n bits can be expressed in $2^n-1$ or fewer bits.

G. Kahan describes the conventional tree search method of Huffman decoding in U.S. Pat. No. 4,899,149 issued Feb. 6, 1990. The tree search method of Huffman decoding minimizes the size of the search memory required for code conversion. However, the search time is relatively long due to the characteristics of tree searching. As a result, it is difficult for the tree search method to be applied to apparatus requiring fast processing, e.g., to digital television, HDTV or the like.

The search time can be reduced by using a look-up table (LUT) stored in codeaddressed memory for decoding variable-length codes directly, which can take a rather simple form, as will now be described. The variable-length code input is supplied to a shift register used as an input address register for LUT memory. The LUT memory address in this input address register is supplied to address decoders within the LUT memory that generate selection signals for storage elements in each addressable storage location. The LUT memory stores the decoding results for each valid variable-length code at each addressable location specified by a LUT memory address having that valid variable-length code as its leading bits. So, when a valid variable-length code provides the leading bits of a LUT memory address, that input address to the LUT memory is accepted as a valid address by the LUT memory. The LUT memory reads out the decoding result corresponding to the valid variable-length code, which decoding result is stored at the validly addressed storage location. Any input address except one in which a valid variable-length code provides the leading bits of the LUT memory address is invalid. In response to any invalid input address, the LUT memory reads out a null result that indicates the LUT memory address is invalid and is thereafter discarded. However, this simple LUT decoding method requires increased memory size, so the die area in a very-large-scale-integrated (VLSI) circuit comprising the Huffman decoder tends to be undesirably large.

These increases in memory size for simple LUT decoding arise with conventional memory layout procedures where storage locations are provided for all addresses of a fixed bit width, when that bit-width is chosen equal to the longest variable-length code. One reason for increased memory size is that the decoding results for each variable-length code are stored at a number of addressable storage locations in the LUT memory, each having a valid address, the number of those addressable storage locations increasing as the variable-length code becomes shorter.

Another reason for increased memory size with LUT decoding is that only a portion of the possible input addresses for the LUT memory are valid addresses. If conventional memory layout procedures are used, to provide a general type of memory configuration that contains storage locations for all input addresses, the storage locations associated with invalid input addresses contain only coding nulls and are wasted. Furthermore, the memory addressing decoders must decode all input addresses, whether they are valid or invalid, in order to select the variable-length decoding results only in response to the valid variable-length codes as correctly positioned in the shift register supplying memory input addresses. Accordingly, the address coding circuitry takes up appreciable space on the die.

These problems are largely overcome in a VLC decoder of a type using a look-up table memory that stores, in a storage location with the same address as the storage location of the decoding result for a variable-length code, an indication of the bit-length of that variable-length code. When one of the variable-length codes is decoded, both the decoding result and the indication of the bit-length of the variable-length code that has been decoded are read from the look-up table memory. The bit-length indication is used to shift the variable-length code within the input address register so as to place the next VLC word directly into the final, "justified" position within the address register that results in the address being valid. This eliminates having to consider most of the invalid addresses and can speed up the time between most table look-ups. These advantages arise because remnants of valid variable-length codes with a plurality of bits do not need to be shifted from the input address register one bit at a time after respective valid addresses occur, before the next valid addresses occur when the next code word is in "justified" position within the address register.

Since storage locations associated with invalid addresses need never be addressed in this type of VLC decoder, the storage elements for most of these storage locations are dispensed with in the look up table memories of preferred decoders. This provides an overall reduction in memory even though each remaining set of storage locations with the same address is increased in size, to include storage locations for storing the indication of the bit-length of the variable-length code giving rise to the decoding result stored in storage locations with the same address.

It is known that division of the complete content of the input address register into two portions that are considered as binary-coded row and column addresses for the memory should be avoided, since this results in an excessive number of address lines with a large number of invalid addresses. Even though storage elements for these storage locations with invalid addresses are dispensed with, the regularity of memory layout is undesirably disrupted, making compact memory layout difficult to achieve.

In certain variable-length coding such as Huffman coding that comprises concatenated variable-length codes, most of the codes in each codeset can be analyzed as being composed of a pointer subcode of variable bit-length and a target subcode of fixed bit-length, the target subcodes being relatively efficiently encoded and the pointer subcodes being relatively inefficiently encoded. The pointer code consists of a string of leading logical ONEs followed by a logical ZERO or, alternatively, consists of a string of leading logical ONEs followed by a logical ZERO. In this disclosure the first alternative will be presumed to be used. However, the modifications of the decoders for the first alternative that are disclosed, in order to design decoders for the second alternative, will be obvious to one skilled in the art of digital circuit design and acquainted with this disclosure.

The pointer subcode can be recoded to be the first positional code, which first positional code is used to point out the position of the target subcode within the same VLC code; then the target subcode is decoded as a binary code to generate a second positional code. The bit places of the first and second positional codes drive respective ones of the access lines of the look-up table memory for decoding results and for bit-lengths of the Huffman codewords giving rise to such decoding results. While this general structure for a Huffman decoder has been previously suggested, there are a number of refinements that can be made to the structure.

A first refinement that can be made in accordance with a first aspect of the invention springs from the inventor's observations that the bit-length of a Huffman codeword is the sum of the bit-lengths of its pointer code portion and of its target code portion and that there is considerable information available concerning at least the bit-length of its pointer code portion. More particularly, the bit-length of the pointer code portion of a Huffman codeword is determined incidentally to generating a first positional code therefrom. Accordingly, rather than storing the bit-lengths of complete Huffman codewords in memory, in order to determine when the next Huffman codeword begins, the bit-lengths of just the target portions of the Huffman codewords can be stored in memory and, when the bit-length of the target portion of a codeword is read from memory, it can be added to the previously determined bit-length of the pointer code portion of the codeword. This results in substantial saving in memory for storing bit lengths. For example, in Huffman coding the codewords of which have maximum length between 32 and 63 bits and have target codes of maximum length of seven bits, the bit lengths of storage locations are halved, being reduced from six bits to only three bits.

A second refinement that can be made in accordance with a second aspect of the invention concerns how the bit length of the pointer code portion of a Huffman codeword is determined. A previous procedure has been to justify the leading bit of the Huffman codeword, then to analyze the successive bits of the Huffman codeword one bit at a time while counting the leading ONEs in the Huffman codeword, transferring the count to a plural-bit-wide latch when a ZERO is finally reached in the Huffman codeword signaling the conclusion of its pointer code portion, and then resetting the counter. This procedure takes as many clock periods as there are bits in the pointer code portion of the Huffman codeword, so rather rapid clock rate is required in order to process Huffman codewords in substantially real time. It is preferable to process the Huffman coding in parallel-bit bytes when determining the bit length of the pointer code, the inventor points out, so a slower clock rate suffices to process Huffman codewords in substantially real time. The inventor uses an AND gain chain to bit-complement non-leading ONEs in each successive byte of Huffman coding, to "cleanse" the byte, then sums the bits of each byte "cleansed" of non-leading ONEs to count the ONEs therein. These sums are accumulated in a first accumulator, until such time as one of these sums is smaller than the sum when all the bits of a byte are ONEs, for determining the bit length of the pointer code. The bit lengths of the increments of pointer code in each byte are binary numbers, which implements their accumulation to generate the bit length of the complete pointer code in binary number form. The complete pointer code being in binary number form facilitates its being added to another binary number drawn from memory which other binary number indicates the bit-length of the target code, thus to generate still another binary number which indicates the bit-length of the complete Huffman codeword. The complete pointer code in binary number form is converted by conventional addressing decoder circuitry to a first positional code for addressing a selected memory line in the memory storing the Huffman decoder LUTs.

A third refinement that can be made in accordance with a third aspect of the invention is to use, within a plural-step operation, the same shifting apparatus for justifying the leading bit of the pointer code of each Huffman codeword and for justifying the leading bit of the target code of each Huffman codeword. A second accumulator is used for controlling the selection of the portion of the Huffman codestream to be processed during each processing step, accumulating the sums of the bits of each byte "cleansed" of non-leading ONEs during each step of processing pointer code and accumulating the bit-length of the target code read from memory during each step of processing target code. This accumulation protocol parses the Huffman codestream selection for successive processing steps, so the leading bit of the pointer code of each Huffman codeword is justified in a respective selection from the codestream, and so the leading bit of the target code of each Huffman codeword is justified in a respective selection from the codestream.

SUMMARY OF THE INVENTION

A decoder embodying the invention decodes variable-length codes of Huffman type supplied in a codestream having data segments in which each successive code word comprises a pointer code segment followed by a target code segment. For all except possibly the shortest code words, decoding is performed in a plurality of successive steps, a plural-bit chunk each step. The construction of the decoder is as follows. Selection circuitry successively selects plural-bit chunks of the pointer code segment and the target code segment of each successive variable-length codeword. The selection circuitry determines the beginning of the pointer code segment of a first one of the variable-length codewords responsive to a start of data segment command. The beginning of the pointer code segment of each further one of the variable-length codewords is determined responsive to the accumulated bit-lengths of the complete variable-length codewords processed by the decoder since the start of data segment command, and the beginning of the target code segment of each of said variable-length codewords is determined with respect to the beginning of the pointer code segment of that same variable-length codeword by an indication of the bit-length of the pointer code segment of that same variable-length codeword. There is circuitry for generating and temporarily storing first partial memory addresses responsive to respective ones of the pointer code segments as successively selected by the selection circuitry, each first partial memory address being such as to furnish indication of the bit-length of the respective one of the pointer codes. Each of the first partial memory addresses is temporarily stored while the selection circuitry successively selects the target code segment next after the one of the pointer code segments responsive to which the temporarily stored first partial memory address was generated. There is circuitry for generating second partial memory addresses responsive to respective ones of the target codes as successively selected by the selection circuitry. First memory addressed by the first and second partial addresses is used for storing look-up tables of decoder output signal. The bit-lengths of the complete variable-length codewords are determined by combining the first partial memory addresses and the bit-lengths of just the target code portions of the complete variable-length codewords. The bit-lengths of just the target code portions of the complete variable-length codewords can be stored in second memory. The second memory can be addressed by at least portions of the first and second partial addresses or, alternatively, can be addressed by at least portions of just the first partial addresses. If the bit-lengths of just the target code portions of the complete variable-length codewords are all the same the second memory can be provided simply as a wired binary number.

A decoder embodying the invention, preferred for decoding Huffman codes with leading ONEs, employs a selector for selecting successive uniform-bit-length portions of the codestream as a selector output signal, selection being in response to a modular count of the bits of a data segment within said codestream, each said uniform-bit-length portion being at least as long as the longest target code segment in any codeword. Circuitry including an AND gate chain bit-complements non-leading ONEs in each uniform-bit-length portion of the codestream selected by the selector, to generate a respective code segment cleansed of non-leading ONEs. Adder circuitry sums the bits of each code segment cleansed of non-leading ONEs to generate a respective sum signal. A NOR gate responsive to the bits of the current sum signal detects when that sum signal is arithmetic zero, to generate an indication of a final step in decoding a code word. A first accumulator accumulates each respective sum signal generated by the adder circuitry to generate a first accumulated output signal. The first accumulated output signal is reset to zero arithmetic value responsive to the first accumulator having a first accumulator reset signal applied thereto. First memory addressed by the first accumulated output signal and at least selected bits of the selector output signal is used for storing look-up tables of decoder output signal. Second memory addressed by the first accumulated output signal and at least selected bits of the selector output signal is used for storing binary numbers indicative of the bit-lengths of just the target code portions of the complete Huffman codes that during the final steps of decoding variable-length code words access decoder output signals stored in the first memory at corresponding addresses. A two-input, single-output multiplexer receives the respective sums generated by the adder circuitry as its first input signal, receives the binary numbers read from the second memory as its second input signal, and selects one of its first and second input signals as its output signal responsive to a control signal. A second accumulator accumulates output signal from the multiplexer to generate a second accumulated output signal that controls the selecting by said selector. The second accumulated output signal is reset to zero arithmetic value responsive to the second accumulator having a second accumulator reset signal applied thereto. An output data latch temporarily stores read-out from the first memory in response to a latching signal. Decoding control circuitry generates the latching signal during each final step in decoding a code word as signaled by the NOR gate used for detecting that the current one the sum signals is arithmetic zero, generates the first accumulator reset signal at the beginning of each data segment and after each final step in decoding a code word as signaled by the NOR gate used for detecting that the current one the sum signals is arithmetic zero, and generates the second accumulator reset signal at the beginning of each data segment.

A decoder embodying the invention, preferred for decoding Huffman codes with leading ZEROs, differs from the decoder preferred for decoding Huffman codes with leading ONEs in that Huffman codes are bit-complemented before being supplied to the circuitry for complementing non-leading ONEs that supplies code segments to the adder circuitry.

DETAILED DESCRIPTION OF THE INVENTION

Figure 1:
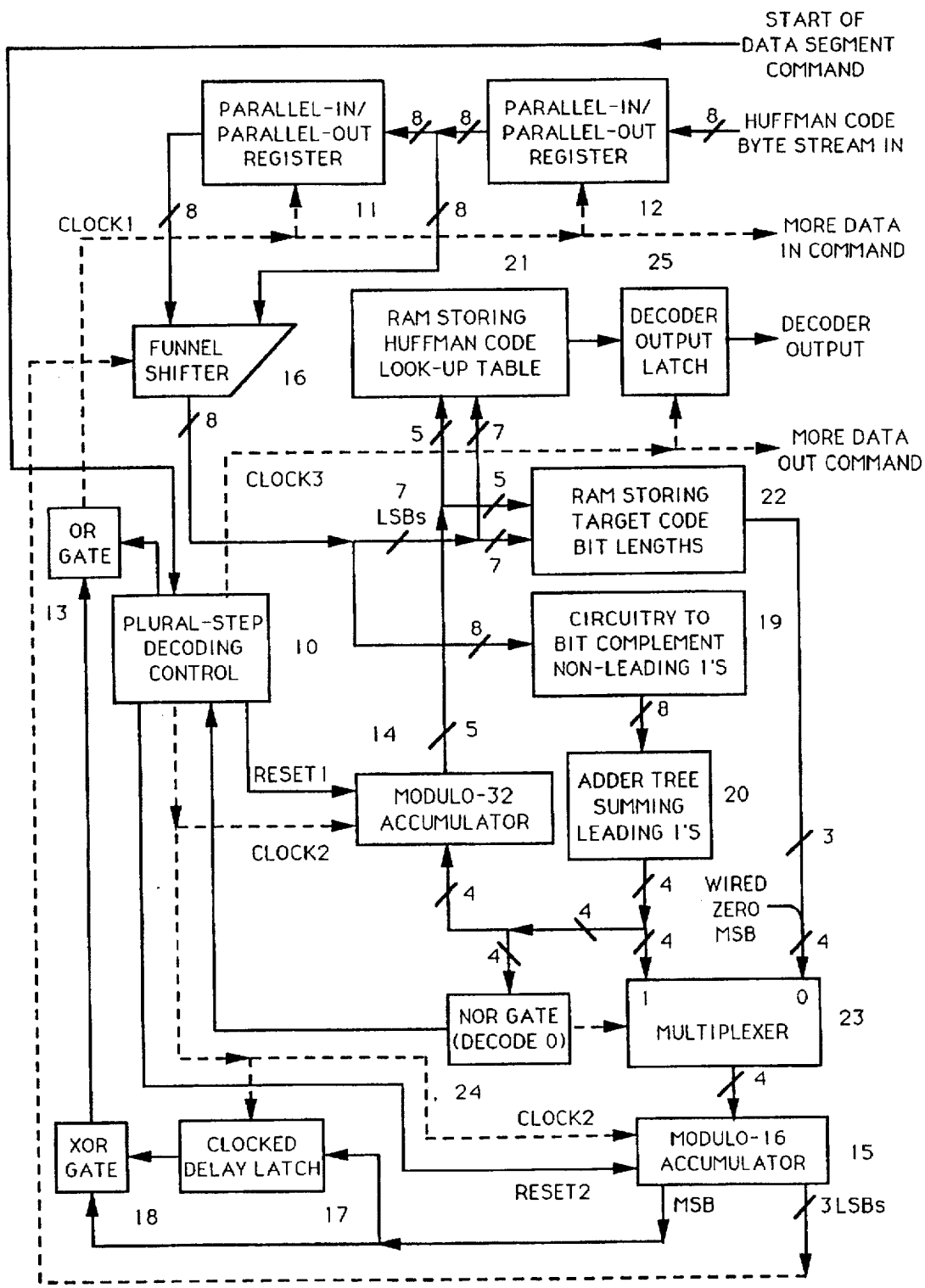
FIG. 1 is a block schematic diagram of a plural-step decoder for variable-length codes of Huffman type having leading ONEs, which decoder embodies the invention.

FIG. 1 shows a plural-step decoder that operates under the direction of a plural-step decoding controller 10. The variable-length code words of the Huffman type code are presumed to begin with leading ONEs and are presumed by way of example to have a maximum length of thirty-nine bits, with the pointer code having up to thirty-two bits and the target code having up to seven bits. Cascaded first and second parallel-in/parallel-out registers 11 and 12 store two consecutive eight-bit bytes of the variable-length coding, including at least one complete variable-length code word.

At the start of a data segment, the initial eight-bit byte of the variable-length code is clocked into the first parallel-in/parallel-out register 11 responsive to a first CLOCK1 pulse; then the second eight-bit byte of the variable-length code is clocked into the first parallel-in/parallel-out register 11 and the initial eight-bit byte of the variable length code is clocked into the second parallel-in/parallel-out register 12 responsive to a second CLOCK1 pulse. This procedure is carried out responsive to a START OF DATA SEGMENT COMMAND being supplied from a host computer (not shown) to the plural-step decoding controller 10. The controller 10 responds to that command to apply two pulses as first input signal to an OR gate 13. The OR gate 13 reproduces the first and second CLOCK1 pulses at its output for application to the parallel-in/parallel-out registers 11 and 12 as clock signals. The CLOCK1 pulses are supplied back to the host computer as a MORE DATA IN COMMAND, the host computer supplying the next sequential byte of the variable-length code responsive to each CLOCK1 pulse. Responsive to the START OF DATA SEGMENT COMMAND the controller 10 generates a RESET 1 pulse and a RESET2 pulse. The controller 10 supplies the RESET1 pulse to a modulo-32 accumulator 14 for resetting the accumulated output signal of the accumulator 14 to arithmetic zero (00000). The controller 10 supplies the RESET2 pulse to a modulo-16 accumulator 15 for resetting the accumulated output signal of the accumulator 15 to arithmetic zero (0000). Thereafter the controller 10 supplies CLOCK2 pulses to the accumulators 14 and 15 for clocking their respective accumulations.

The sixteen bits parallel bits of the Huffman code byte stream that appear at the outputs of the parallel-in/parallel-out registers 11 and 12 are applied as input signal to a funnel shifter 16. The funnel shifter 16 is a truncated barrel shifter that responds to a binary-arithmetic number furnished as a shift command, for shifting its input signal the specified number of bits, causing a selected eight-bit-wide portion of that input signal to appear in an eight-bit-wide output window as output signal. In the first step of decoding each successive variable-length code word, the code word has been shifted to place its leading bit in the leading-bit position of the funnel shifter 16 output window. In the final step of decoding each successive variable-length code word, the code word has been shifted to place the trailing bit of the target code portion of the complete code word in the leading-bit position of the funnel shifter 16 output window. In each successive step of decoding a variable-length code word between the first and final step(s), if such successive step be, the code word has been shifted an additional eight bits within the funnel shifter 16 output window.

The modulo-16 accumulator 15 keeps track of the number of bits in the Huffman code stream that have been analyzed in the successive steps since the beginning of the data segment, so the parallel-in/parallel-out registers 11 and 12 can be refilled as needed, and so the funnel shifter 16 selects to its 8-bit-wide output window the desired portion of the data it is supplied from the registers 11 and 12. A single-bit-wide clocked latch 17 delays the most significant bit of the accumulated output signal of the modulo-16 accumulator 15, so change in that bit can be detected by a two-input exclusive-OR gate 18 comparing the current most significant bit received as its first input signal with the previous most significant bit received as its second input signal. The ONE that results in the exclusive-OR gate 18 response when there is a change in the most significant bit of the accumulated output signal of the modulo-16 accumulator 15 is supplied to the OR gate 13. The OR gate 13 responds to this ONE with another ONE, applied as a CLOCK1 pulse to the parallel-in/parallel-out registers 11 and 12 as clock signal, and furnished to the host computer as a MORE DATA IN COMMAND. This procedure refills the parallel-in/parallel-out registers 11 and 12 as needed and provides full-byte shifts of the data supplied at the output window of the funnel shifter 16. The binary-arithmetic number furnished as a shift command to the funnel shifter 16 consists of the three least-significant bits of the accumulated output signal of the accumulator 15. The response to this shift command is a partial-byte shift of the data supplied at the output window of the funnel shifter 16.

The complete output signal from the funnel shifter 16 is supplied as input signal to circuitry 19, which responds to the eight-bit-wide output signal from the funnel shifter 16 with a response in which non-leading ONEs are bit-complemented to ZEROs, to "cleanse" that code segment of non-leading ONEs. This facilitates using a digital adder tree 20 for counting the leading ONEs in the output signal from the funnel shifter 16 to generate a 4-bit-wide binary number, which is accumulated in the modulo-32 accumulator 14. The accumulator 14 keeps track of the number of leading ONEs in the pointer code of the variable-length codeword as thus far analyzed. When the final step of decoding a variable-length code word is reached, this procedure will have converted the unary coding of the pointer code to a corresponding binary code. The conversion will have reduced the number of bits used for pointer coding (base two) logarithmically. The accumulated output signal from the accumulator 14 supplies a portion of the input addressing applied to random access memories (RAMs) 21 and 22, and the seven trailing bits of the output signal from the funnel shifter 16 supply the remaining portion of their input addressing.

The RAMs 21 and 22 are both operated as read-only memories (ROMs), and their input addressing generates valid read-out only during the final step of decoding a variable-length code word. During this final step of decoding, the accumulated output signal from the accumulator 15 supplies converted pointer code that points out or addresses the appropriate submemory in each of the RAMs 21 and 22 that is to be further addressed by target code value for selecting the look-up table value of the variable-length codeword. During this final step of decoding, the seven trailing bits of the output signal from the funnel shifter 16 contain the bits of the target code in justified form. The RAM 21 stores a look-up table for Huffman codes. The RAM 22 stores binary numbers indicative of the bit-lengths of just the target code portions that during the final steps of decoding variable-length code words access decoder output signals stored in said first memory at corresponding addresses A two-input/single-output digital multiplexer 23 receives as a first input thereto the 4-bit wide binary number supplied as the sum output signal of the adder tree 20, which sum output signal indicates the number of leading ONEs in the current funnel shifter 16 response. The target code bit-length furnished by the RAM 21 is a 3-bit binary number, which a wired-zero most significant bit extends to a 4-bit binary number applied as a second input to the two-input/single-output digital multiplexer 23.

A decoder 24 functions as a 4-input NOR gate, responding to the bits in the sum output signal of the adder tree 20 to generate a response that is a ONE when all four bits of that signal are ZEROs and otherwise is a ZERO. The decoder 24 response is supplied to the controller 10 and is applied as control signal to a two-input/single-output digital multiplexer 23. The decoder 24, by generating a ONE when and only when all four bits of the binary number supplied thereto from the adder tree 20 are ZEROs, decodes the arithmetic zero condition that indicates that the current leading bit of the funnel shifter 16 response is a ZERO. This occurs when the last trailing bit of the pointer code portion of the Huffman code is the current leading bit of the funnel shifter 16 response, during the final step of decoding a variable-length coding word. The seven current trailing bits in the funnel shifter 16 response will then comprise the target code and, if the target code is shorter than seven bits in length, a bit or bits from the succeeding portion of the Huffman code stream.

The multiplexer 23 responds to its control signal, supplied from the decoder 24, being a ONE to select the target code bit-length, furnished by the RAM 21 and extended with a wired-zero most significant bit, as input signal for the modulo-16 accumulator 15. The accumulated output signal from the accumulator 14 accordingly supplies a shift command to the funnel shifter 16 that in the next decoding step will bring the leading bit of the next variable-length code word to the leading bit position in the output window of the funnel shifter 16.

The controller 10 responds to a ONE being supplied thereto from the decoder 24 to generate a third clock signal CLOCK2 and to generate another RESET1 signal thereafter. This other RESET1 signal is applied to the modulo-32 accumulator 14 for resetting its accumulated output signal to 00000 and thereby conditioning accumulator 14 for keeping track of the number of leading ONEs in the pointer code of the next variable-length codeword.

An 8-bit-wide clocked latch 25 is conditioned by the second clock signal CLOCK2 to store temporarily the result of table look-up of the decoded value of the Huffman code, which is read out from the RAM 21 during the final step of decoding the variable-length codeword. The second clock signal CLOCK2 is also supplied to the host computer as a MORE DATA OUT COMMAND that conditions the host computer to transfer the contents of the decoder output latch 25 to a first-in/first-out input memory stage included in the host computer.

Figure 2:
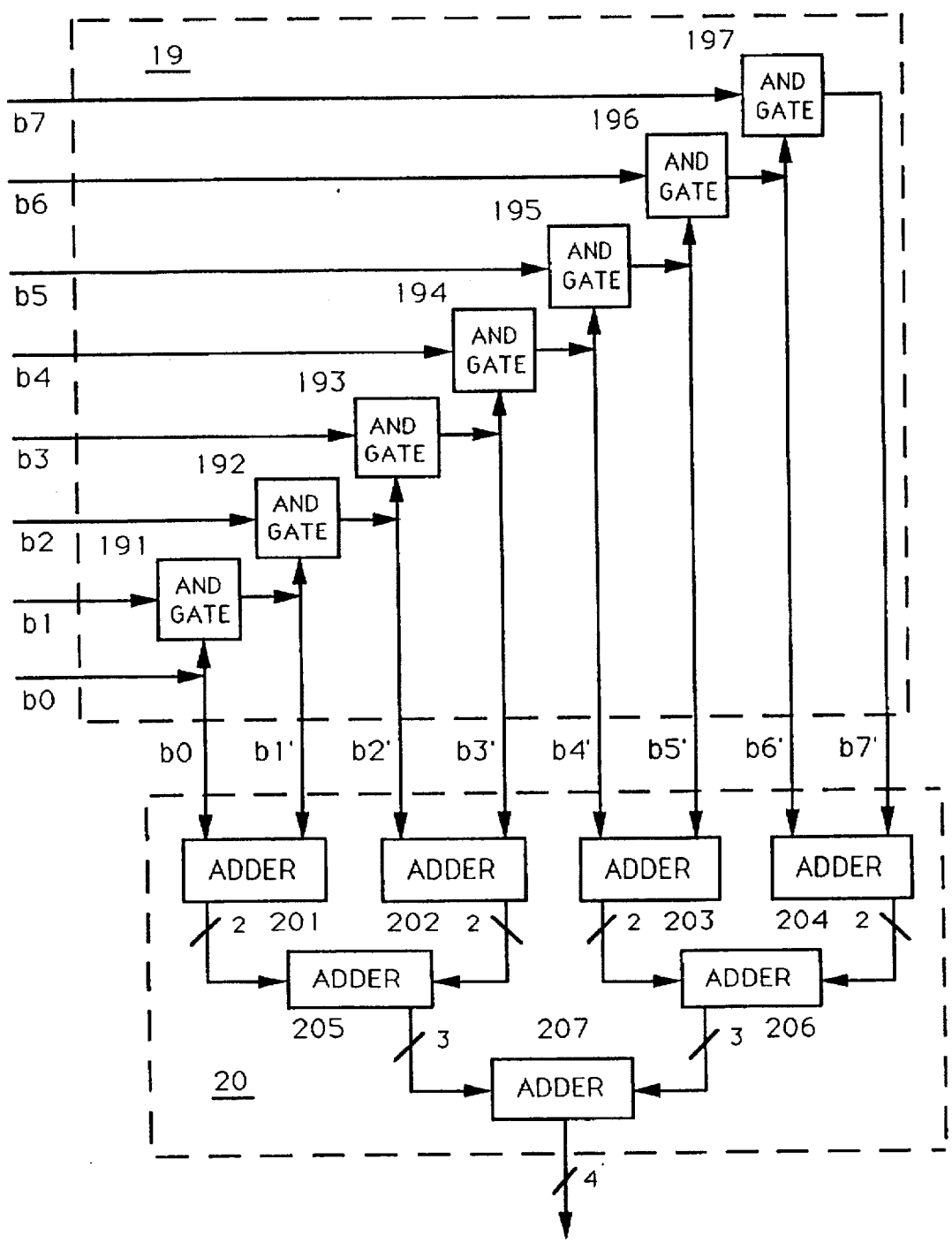
FIG. 2 is a detailed block schematic diagram of circuitry that can be used in the FIG. 1 decoder for determining the number of leading ONEs in each successively considered segment of the codestream.

FIG. 2 shows in more detail the construction of the circuitry 19 and the adder tree 20 shown as respective blocks in FIG. 1. A first two-input AND gate 191 in the circuitry 19 receives the leading bit b0 and first bit b1 after b0 of the funnel shifter 16 response as first and second inputs, respectively. A second two-input AND gate 192 in the circuitry 19 receives the AND gate 191 response and the second bit b2 after the leading bit b0 of the funnel shifter 16 response as first and second inputs, respectively. A third two-input AND gate 193 in the circuitry 19 receives the AND gate 192 response and the third bit b3 after the leading bit b0 of the funnel shifter 16 response as first and second inputs, respectively. A fourth two-input AND gate 194 in the circuitry 19 receives the AND gate 193 response and the fourth bit b4 after the leading bit b0 of the funnel shifter 16 response as first and second inputs, respectively. A fifth two-input AND gate 195 in the circuitry 19 receives the AND gate 194 response and the fifth bit b5 after the leading bit b0 of the funnel shifter 16 response as first and second inputs, respectively. A sixth two-input AND gate 196 in the circuitry 19 receives the AND gate 195 response and the sixth bit b6 after the leading bit b0 of the funnel shifter 16 response as first and second inputs, respectively. Finally, a seventh two-input AND gate 197 in the circuitry 19 receives the AND gate 196 response and the seventh bit b7 after the leading bit b0 of the funnel shifter 16 response as first and second inputs, respectively.

If bit b0 is a leading ZERO, so the first input of the AND gate 191 is ZERO, the response b1' of the AND gate 191 is ZERO. Since the response b1' of the AND gate 191 is ZERO, so the first input of the AND gate 192 is ZERO, the response b2' of the AND gate 192 is ZERO. Since the response b2' of the AND gate 192 is ZERO, so the first input of the AND gate 193 is ZERO, the response b3' of the AND gate 193 is ZERO. Since the response b3' of the AND gate 193 is ZERO, so the first input of the AND gate 194 is ZERO, the response b4' of the AND gate 194 is ZERO. Since the response b4' of the AND gate 194 is ZERO, so the first input of the AND gate 195 is ZERO, the response b5' of the AND gate 195 is ZERO. Since the response b5' of the AND gate 195 is ZERO, so the first input of the AND gate 196 is ZERO, the response b6' of the AND gate 196 is ZERO. Since the response b6' of the AND gate 196 is ZERO, so the first input of the AND gate 197 is ZERO, the response b7' of the AND gate 197 is ZERO. If bit b0 is a leading ONE, so the first input of the AND gate 191 is ONE, the response b1' of the AND gate 191 is logically the same as the second input b1 of the AND gate 191.

If bit b1 is a leading ZERO, so the second input of the AND gate 191 is ZERO, the response b1' of the AND gate 191 is ZERO. Since the response b1' of the AND gate 191 is ZERO, so the first input of the AND gate 192 is ZERO, the response b2' of the AND gate 192 is ZERO. Since the response b2' of the AND gate 192 is ZERO, so the first input of the AND gate 193 is ZERO, the response b3' of the AND gate 193 is ZERO. Since the response b3' of the AND gate 193 is ZERO, so the first input of the AND gate 194 is ZERO, the response b4' of the AND gate 194 is ZERO. Since the response b4' of the AND gate 194 is ZERO, so the first input of the AND gate 195 is ZERO, the response b5' of the AND gate 195 is ZERO. Since the response b5' of the AND gate 195 is ZERO, so the first input of the AND gate 196 is ZERO, the response b6' of the AND gate 196 is ZERO. Since the response b6' of the AND gate 196 is ZERO, so the first input of the AND gate 197 is ZERO, the response b7' of the AND gate 197 is ZERO. If bit b1 is a leading ONE, so the second input of the AND gate 191 is ONE, the response b2' of the AND gate 192 is logically the same as the second input b2 of the AND gate 192.

If bit b2 is a leading ZERO, so the second input of the AND gate 192 is ZERO, the response b2' of the AND gate 192 is ZERO. Since the response b2' of the AND gate 192 is ZERO, so the first input of the AND gate 193 is ZERO, the response b3' of the AND gate 193 is ZERO. Since the response b3' of the AND gate 193 is ZERO, so the first input of the AND gate 194 is ZERO, the response b4' of the AND gate 194 is ZERO. Since the response b4' of the AND gate 194 is ZERO, so the first input of the AND gate 195 is ZERO, the response b5' of the AND gate 195 is ZERO. Since the response b5' of the AND gate 195 is ZERO, so the first input of the AND gate 196 is ZERO, the response b6' of the AND gate 196 is ZERO. Since the response b6' of the AND gate 196 is ZERO, so the first input of the AND gate 197 is ZERO, the response b7' of the AND gate 197 is ZERO. If bit b2 is a leading ONE, so the second input of the AND gate 192 is ONE, the response b3' of the AND gate 193 is logically the same as the second input b3 of the AND gate 193.

If bit b3 is a leading ZERO, so the second input of the AND gate 193 is ZERO, the response b3' of the AND gate 193 is ZERO. Since the response b3' of the AND gate 193 is ZERO, so the first input of the AND gate 194 is ZERO, the response b4' of the AND gate 194 is ZERO. Since the response b4' of the AND gate 194 is ZERO, so the first input of the AND gate 195 is ZERO, the response b5' of the AND gate 195 is ZERO. Since the response b5' of the AND gate 195 is ZERO, so the first input of the AND gate 196 is ZERO, the response b6' of the AND gate 196 is ZERO. Since the response b6' of the AND gate 196 is ZERO, so the first input of the AND gate 197 is ZERO, the response b7' of the AND gate 197 is ZERO. If bit b3 is a leading ONE, so the second input of the AND gate 193 is ONE, the response b4' of the AND gate 194 is logically the same as the second input b4 of the AND gate 194.

If bit b4 is a leading ZERO, so the second input of the AND gate 194 is ZERO, the response b4' of the AND gate 194 is ZERO. Since the response b4' of the AND gate 194 is ZERO, so the first input of the AND gate 195 is ZERO, the response b5' of the AND gate 195 is ZERO. Since the response b5' of the AND gate 195 is ZERO, so the first input of the AND gate 196 is ZERO, the response b6' of the AND gate 196 is ZERO. Since the response b6' of the AND gate 196 is ZERO, so the first input of the AND gate 197 is ZERO, the response b7' of the AND gate 197 is ZERO. If bit b4 is a leading ONE, so the second input of the AND gate 194 is ONE, the response b5' of the AND gate 195 is logically the same as the second input b5 of the AND gate 195.

If bit b5 is a leading ZERO, so the second input of the AND gate 195 is ZERO, the response b5' of the AND gate 195 is ZERO. Since the response b5' of the AND gate 195 is ZERO, so the first input of the AND gate 196 is ZERO, the response b6' of the AND gate 196 is ZERO. Since the response b6' of the AND gate 196 is ZERO, so the first input of the AND gate 197 is ZERO, the response b7' of the AND gate 197 is ZERO. If bit b5 is a leading ONE, so the second input of the AND gate 195 is ONE, the response b6' of the AND gate 196 is logically the same as the second input b6 of the AND gate 196.

If bit b6 is a leading ZERO, so the second input of the AND gate 196 is ZERO, the response b6' of the AND gate 196 is ZERO. Since the response b6' of the AND gate 196 is ZERO, so the first input of the AND gate 197 is ZERO, the response b7' of the AND gate 197 is ZERO. If bit b6 is a leading ONE, so the second input of the AND gate 196 is ONE, the response b7' of the AND gate 197 is logically the same as the second input b7 of the AND gate 197.

The operation of the AND gate chain in circuitry 19, then, is such that every bit after a leading ZERO in the funnel shifter 16 response that is a ONE is bit-complemented to a ZERO. The digital adder tree 20 converts the resulting unary arithmetic number to a binary arithmetic number. The digital adder tree 20 does this by summing the bits b0, b1', b2', b3', b4', b5', b6', b7' and b8' in the 8-bit wide response of the circuitry 19.

More particularly, the bits b0 and b1' are added in a digital adder 201; the bits b2' and b3' are added in a digital adder 202; the bits b4' and b5' are added in a digital adder 203; and the bits b6' and b7' are added in a digital adder 204. Then, the 2-bit-wide sum outputs of the digital adders 201 and 202 are added in a digital adder 205; and the 2-bit-wide sum outputs of the digital adders 203 and 204 are added in a digital adder 206. Finally, the 3-bit-wide sum outputs of the digital adders 205 and 206 are added in a digital adder 207, the sum output of which is the 4-bit-wide binary number supplied to the modulo-32 accumulator 14 for accumulation and supplied to the multiplexer 23 as its first input.

Figure 3:
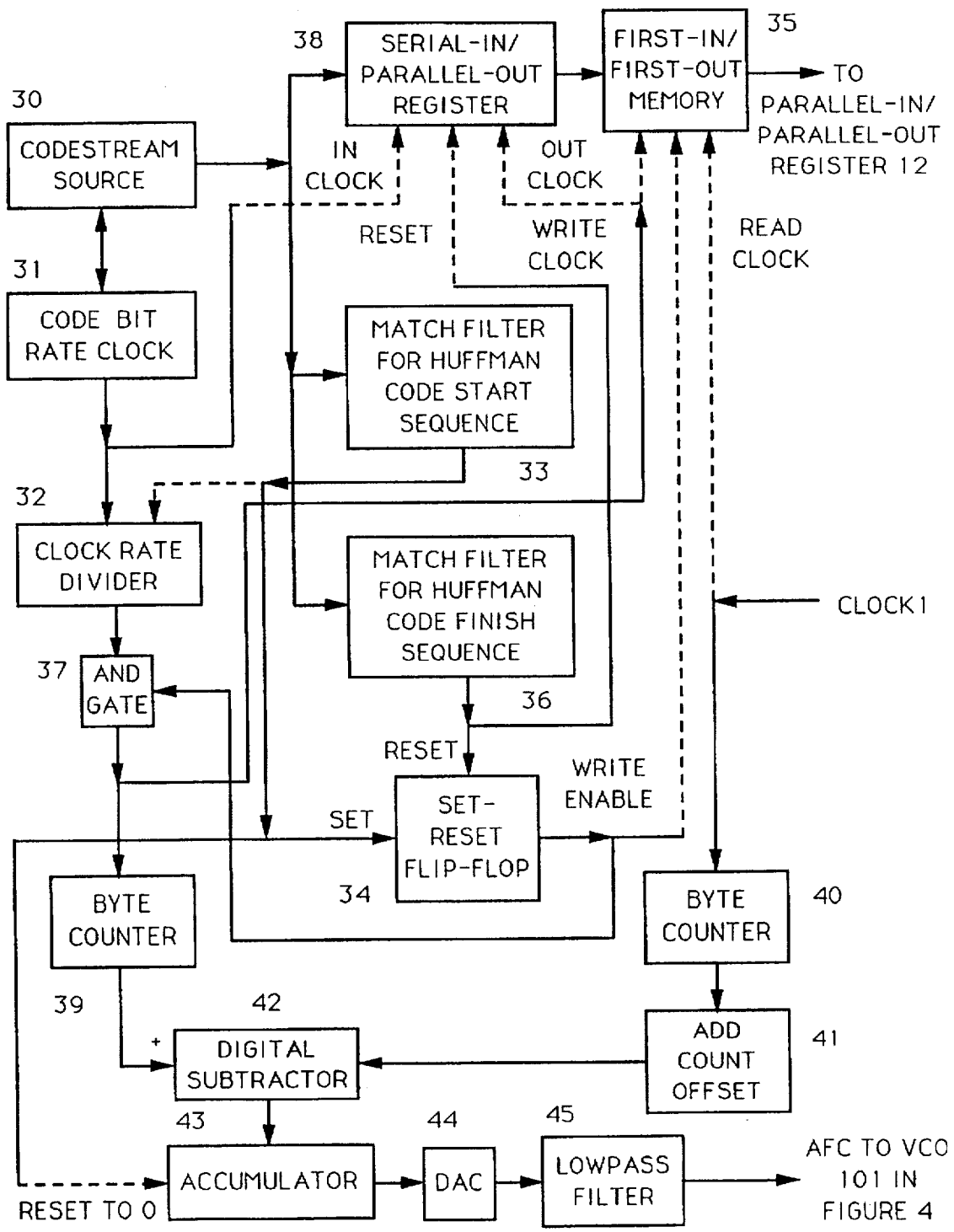
FIG. 3 is a block schematic diagram of representative circuitry for preceding the FIG. 1 decoder and for converting a Huffman code bitstream to a succession of bytes.

FIG. 3 shows representative circuitry for preceding the FIG. 1 decoder and for converting a Huffman code bitstream to a succession of bytes. A source 30 of code is supplied in serial-bit form is provided via a code transmission link and contains at times variable-length codewords of Huffman type. Conventional methods are used for synchronizing a code bit rate clock generator 31 to the bits of the code supplied from the source 30. A clock rate divider 32 divides the bit rate clock signal generated by the code bit rate clock generator 31, to supply a byte rate clock signal. Rate division is by the number of bits per byte, eight in the case of the FIG. 1 decoder. A match filter 33 detects the occurrence of the Huffman code start sequence in the code supplied from the source 30, to supply to the clock rate divider 32 a pulse response for synchronizing the byte rate clock signal with the start of the Huffman type coding that the FIG. 1 decoder is to decode. This pulse response is applied as set signal to a set-reset flip-flop 34 that when set supplies a write enable signal to a first-in/first-out memory 35. Another match filter 36 detects the occurrence of the Huffman code finish sequence in the code supplied from the source 30, which finish sequence may be the start sequence of other coding, to supply a pulse response applied as reset signal the set-reset flip-flop 34. An AND gate 37 responds to the flip-flop 34 being in its set condition and to the byte rate clock signal generated by the clock rate divider 32 to supply a gated byte rate clock signal as write clock signal to the FIFO memory 35. A serial-in/parallel-out register 38 receives the code supplied in serial-bit form from the source 30 thereof, as clocked by the bit rate clock signal generated by the code bit rate clock generator 31, and supplies the code in parallel-bit bytes for storage in the FIFO memory 35, as clocked by the gated byte rate clock signal generated by the clock rate divider 32.

The concern is to read from the FIFO memory 35 at such rate that it never overfills with the bytes of the Huffman type coding that the SIPO register 38 writes into the FIFO memory 35. This concern arises since the FIG. 1 decoder does not read bytes from the FIFO memory 35 at a uniform byte clock rate, but rather as demanded. The long-term-average rate that bytes are read from the FIFO memory 35 can be controlled by adjusting the rate of the clock signals generated by the plural-step decoding controller 10 in the FIG. 1 decoder to regulate the demand for bytes of the Huffman type coding. To permit such regulation a feedback signal indicative of the difference in the rates of writing bytes into the FIFO memory 35 and of reading bytes from the FIFO memory 35 is required.

A byte counter 39 counts the number of pulses in the gated byte rate clock signal the AND gate 37 supplies to the FIFO memory 35 to determine the number of bytes written into the FIFO memory 35. A byte counter 40 counts the number of CLOCK1 pulses generated by the FIG. 1 decoder to determine the number of bytes read from the FIFO memory 35. A digital adder 41 receives count from the byte counter 40 as a first summand and adds to that first summand a wired second summand equal to a fraction (e.g., one-half of the byte storage capability of the FIFO memory 35 that, considering the particular coding of Huffman type, is decided upon as the normal fullness of the FIFO memory 35. A digital subtractor 42 receives the count of bytes read into the FIFO memory 35 from the byte counter 39 as a minuend signal and receives the sum output of the digital adder 41 as a subtrahend. The difference signal from the subtractor 42 indicates the departure of the number of bytes currently stored in the FIFO memory 35 from the desideratum and is supplied to an accumulator 43 which acts as a digital integrator for this error signal. The accumulated output signal supplied from the accumulator 43 as a digital integrated error is reset to arithmetic zero by the pulse supplied by the match filter 33 when it detects the occurrence of the Huffman code start sequence in the code supplied from the source 30. The digital integrated error signal from the accumulator 43 is converted to an analog integrated error signal by a digital-to-analog converter 44. The analog integrated error signal from the DAC 44 is further filtered by an analog lowpass filter 45.

Figure 4:
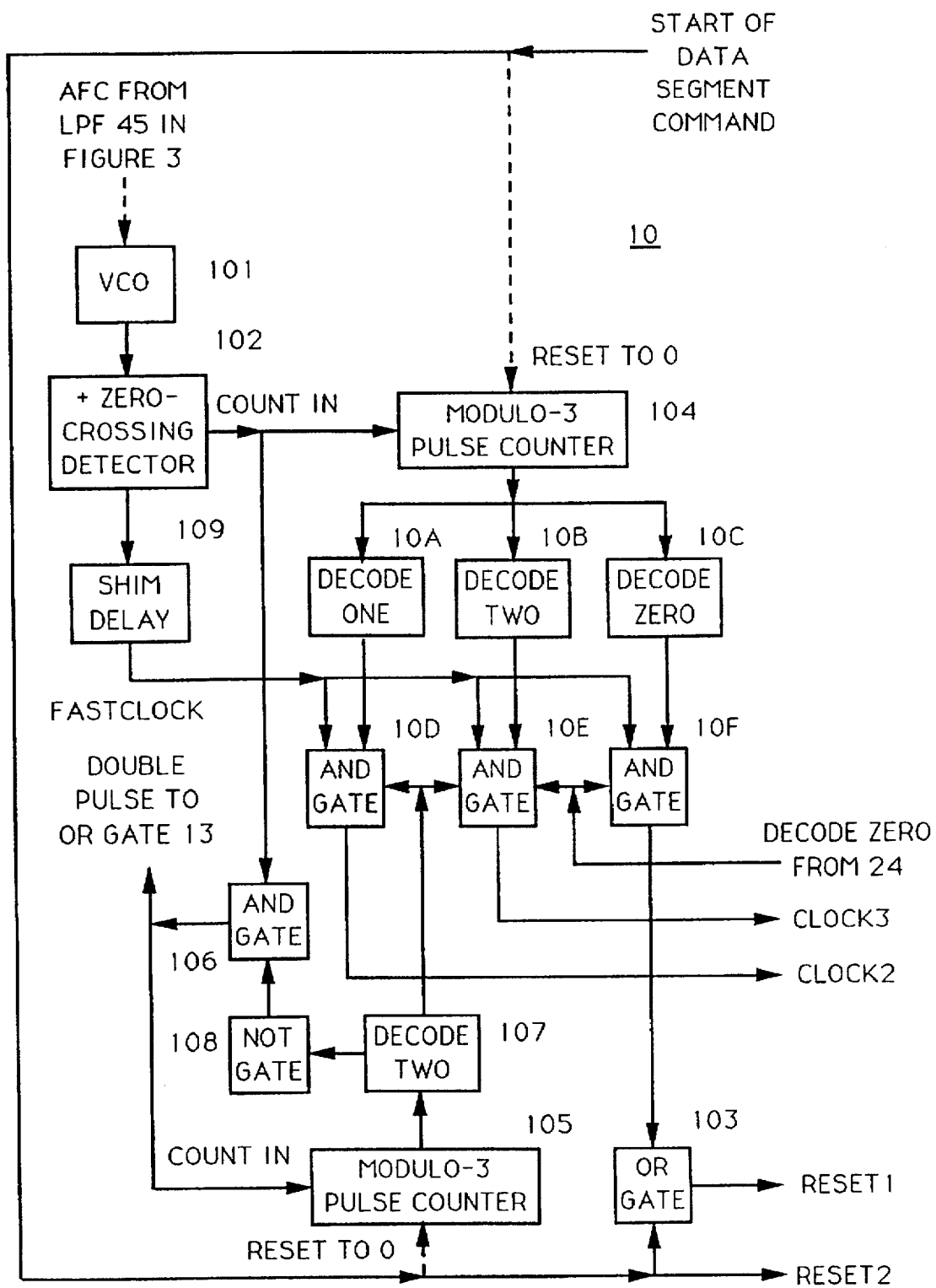
FIG. 4 is a block schematic diagram of detailed block schematic diagram of the plural-step decoding controller used in the FIG. 1 decoder.

FIG. 4 is a block schematic diagram of detailed block schematic diagram of the plural-step decoding controller 10 used in the FIG. 1 decoder. The lowpass-filtered analog integrated error signal from the analog lowpass filter 45 of FIG. 3 is applied as an automatic frequency control (AFC) signal to a voltage-controlled oscillator 101 in the controller 10. The VCO 101 has a natural frequency about three times the byte clock signal generated by the clock rate divider 32. A positive zero-crossing detector 102 generates logic ONE pulses on a logic ZERO baseline when the output oscillations from the VCO 101 cross their average-value axis in a positive sense, to develop logic ONE pulses at a rate about three times the byte clock rate of the signal generated by the clock rate divider 32. (Alternatively, logic ONE pulses at a rate about three times the byte clock rate of the signal generated by the clock rate divider 32 could be generated using a negative zero-crossing detector responsive to the output oscillations from the VCO 101 crossing their average-value axis in a negative sense.)

The START OF DATA SEGMENT COMMAND, which is a logic ONE, is supplied as first input signal to an OR gate 103 to generate a RESET1 signal used to reset the FIG. 1 accumulator 14 accumulated output signal to ZERO. The START OF DATA SEGMENT COMMAND provides a RESET2 signal used to reset the FIG. 1 accumulator 15 accumulated output signal to ZERO. The START OF DATA SEGMENT COMMAND also resets two pulse counters 104 and 105 to zero count. The logic ONE pulses generated by the zero-crossing detector 102 are applied directly to the counter 104 to be counted modulo-3 and are applied as first input signal to a two-input AND gate 106, the output signal of which is applied to the counter 105 to have logic ONE pulses therein counted modulo-3. A decoder 107 detects the count from the counter 105 not being two to supply an output signal that is a ZERO and detects the count being two to supply an output signal that is a ONE. The decoder 107 output signal is complemented by a NOT gate 108 to generate a second input signal for the AND gate 106.

When the counter 105 is reset to zero count, the decoder 107 response is a ZERO, which the NOT gate 108 complements to generate a ONE response applied as second input signal for the AND gate 106. This conditions the AND gate 106 to supply pulses to the counter 105 in response to logic ONE pulses generated by the positive zero-crossing detector 102. The AND gate 106 supplies two pulses to the counter 105 before the count therefrom reaches two, so the decoder 107 response is a ONE that the NOT gate 108 complements to generate a ZERO response applied as second input signal for the AND gate 106. The AND gate 106 response becomes ZERO, so the counter 105 receives no more ONE pulses for counting and its output count remains at two until reset to zero by the next START OF DATA SEGMENT COMMAND being applied to the counter 105. The two ONE pulses supplied from the AND gate 1065 after each START OF DATA SEGMENT COMMAND are applied as the first input signal to the OR gate 13. The OR gate 13 responds to supply the first and second CLOCK1 pulses to the parallel-in/parallel-out registers 11 and 12 and to the host computer as a MORE DATA IN COMMAND, loading the registers 11 and 12 with respective bytes of the variable-length coding of Huffman type.

A decoder 10A detects the counter 104 modulo-3 count being one; a decoder 10B detects the counter 104 count being two; and a decoder 10C detects the counter 104 count being zero (three). The logic ONE pulses generated by the zero-crossing detector 102 are delayed slightly by shim delay 109. A three-input AND gate 10C ANDs these slightly delayed pulses with the response of the decoder 10A and with the output signal of the decoder 107. The decoder 107 supplies a ONE continuously after the registers 11 and 12 are initially loaded just after the START OF DATA SEGMENT COMMAND. Accordingly, the AND gate 10C selects the first of each successive group of three logic ONE pulses generated by the zero-crossing detector 102, to be applied to the accumulators 14 and 15 in FIG. 1 as the CLOCK3 signal that begins each successive step of decoding.

A four-input AND gate 10E and a three-input AND gate 10F receive the output from the decoder 24 in FIG. 1, which decoder 24 generates a response that is a ONE when the bits in the sum output signal of the adder tree 20 are all ZEROs and otherwise is a ZERO. Subject to the condition that both the decoder 24 response and the decoder 107 response are ONEs, which indicates the final step of decoding a Huffman type codeword, which condition obtains only during the final step of decoding each successive variable-length codeword, the AND gate 10E in FIG. 4 responds to the decoder 105 output signal for selecting the second of each successive group of three logic ONE pulses generated by the zero-crossing detector 102. The AND gate 10E supplies the logic ONE pulses it selects as CLOCK2 signal applied to the clocked decoder output latch 25 in FIG. 1 as its latch command. The accumulated output signal from the accumulator 14 must be subsequently reset to arithmetic zero before the first step of decoding the next Huffman type codeword.

Subject to the condition that both the decoder 24 response and the decoder 107 response are ONEs, the AND gate 10F in FIG. 4 responds to the decoder 10C output signal for selecting the third one of each successive group of three logic ONE pulses generated by the zero-crossing detector 102 to be applied as a second input signal to the OR gate 103. The OR gate 103 responds to the START OF DATA SEGMENT COMMAND to supply a logic ONE to the accumulator 14 for initially resetting the accumulated output signal therefrom to arithmetic zero before the first step of decoding the initial Huffman type codeword in a data segment. Thereafter, the OR gate 103 responds to the logic ONE pulses from the AND gate 10F to supply a logic ONE to the accumulator 14 for resetting the accumulated output signal therefrom to arithmetic zero before the first step of decoding each successive Huffman type codeword in the data segment.

Referring back to FIG. 1, if all the target codes are shorter than seven bits in length, the second partial addresses for the RAMs 21 and 22 can be correspondingly shortened.

Figure 5:
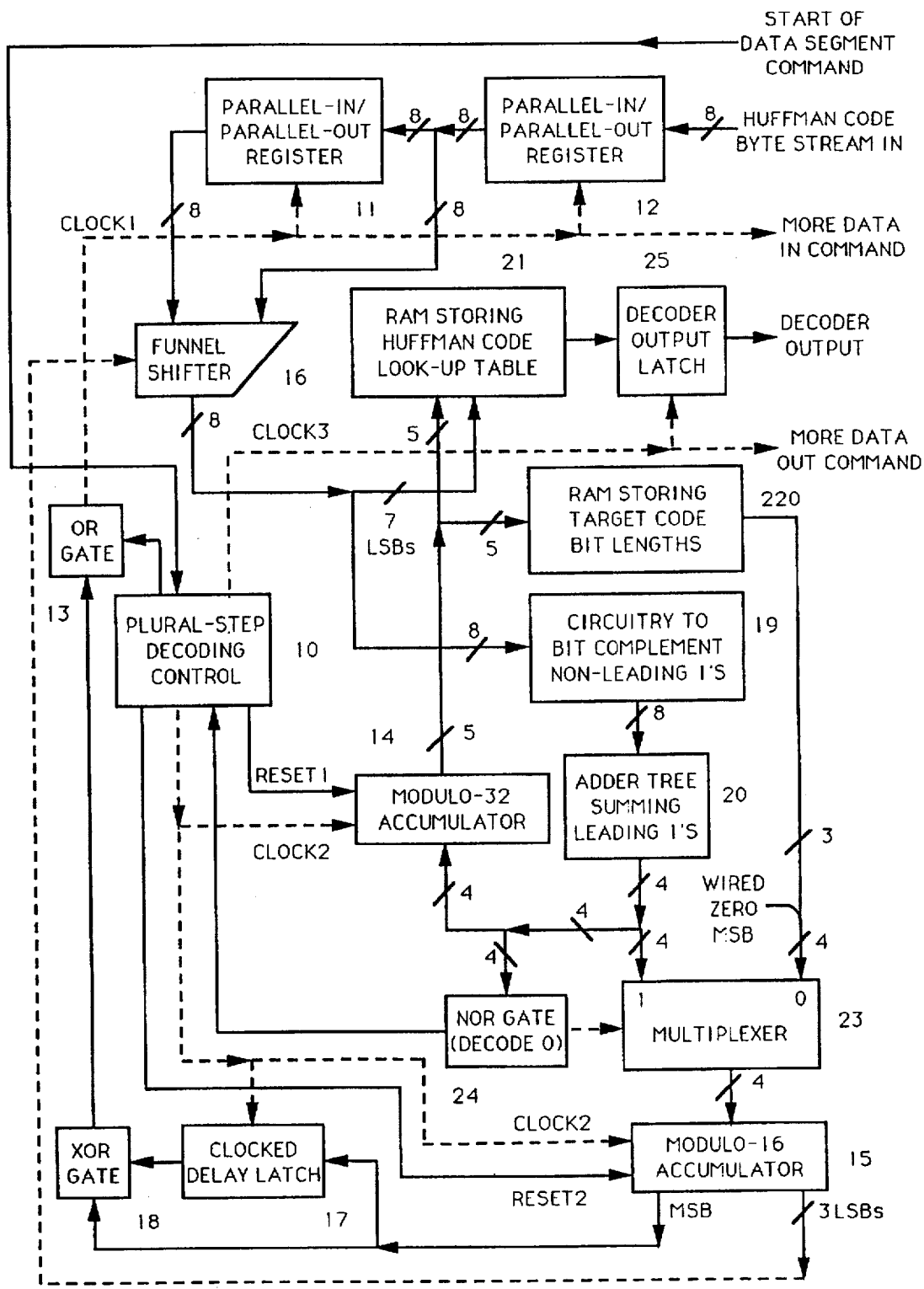
FIGS. 5 and 6 are each a block schematic diagram of a plural-step decoder for variable-length codes of Huffman type, which decoder is a modification of the FIG. 1 VLC decoder and embodies the invention.

FIG. 5 shows a modification that can be made to the FIG. 1 VLC decoder when all the target codes for each pointer code are of the same bit-length. The RAM 22 of the FIG. 1 VLC decoder addressed by a first partial address furnished by the accumulated output signal of the accumulator 14 and a second partial address taken from the output signal of the funnel shifter 16 is replaced by a RAM 220 addressed solely by the first partial address furnished by the accumulated output signal of the accumulator 14. Under circumstances where some of the pointer codes have target codes of the same bit-length associated with them, fewer than all of the bits of the first partial address may be used when addressing the RAM 22 or 220.

Figure 6:
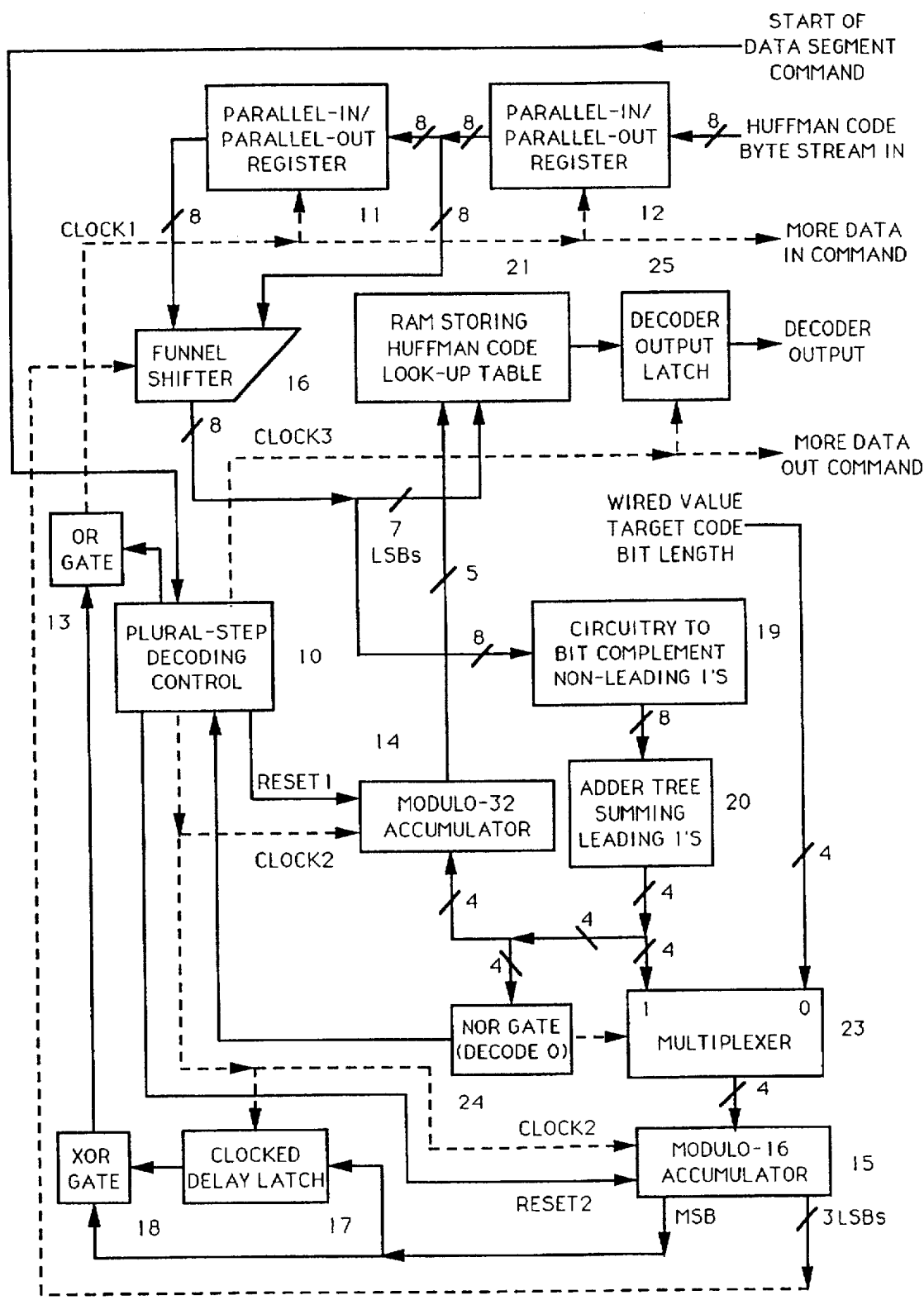

FIG. 6 shows an alternative modification that can be made to the FIG. 1 VLC decoder when all the target codes for all pointer codes are of the same bit-length. This condition is artificially made possible by storing short codewords at multiple locations in memory. The RAM 22 is dispensed with, and a wired binary number indicative of target code length is applied to the second input of the multiplexer 23.

Figure 7:
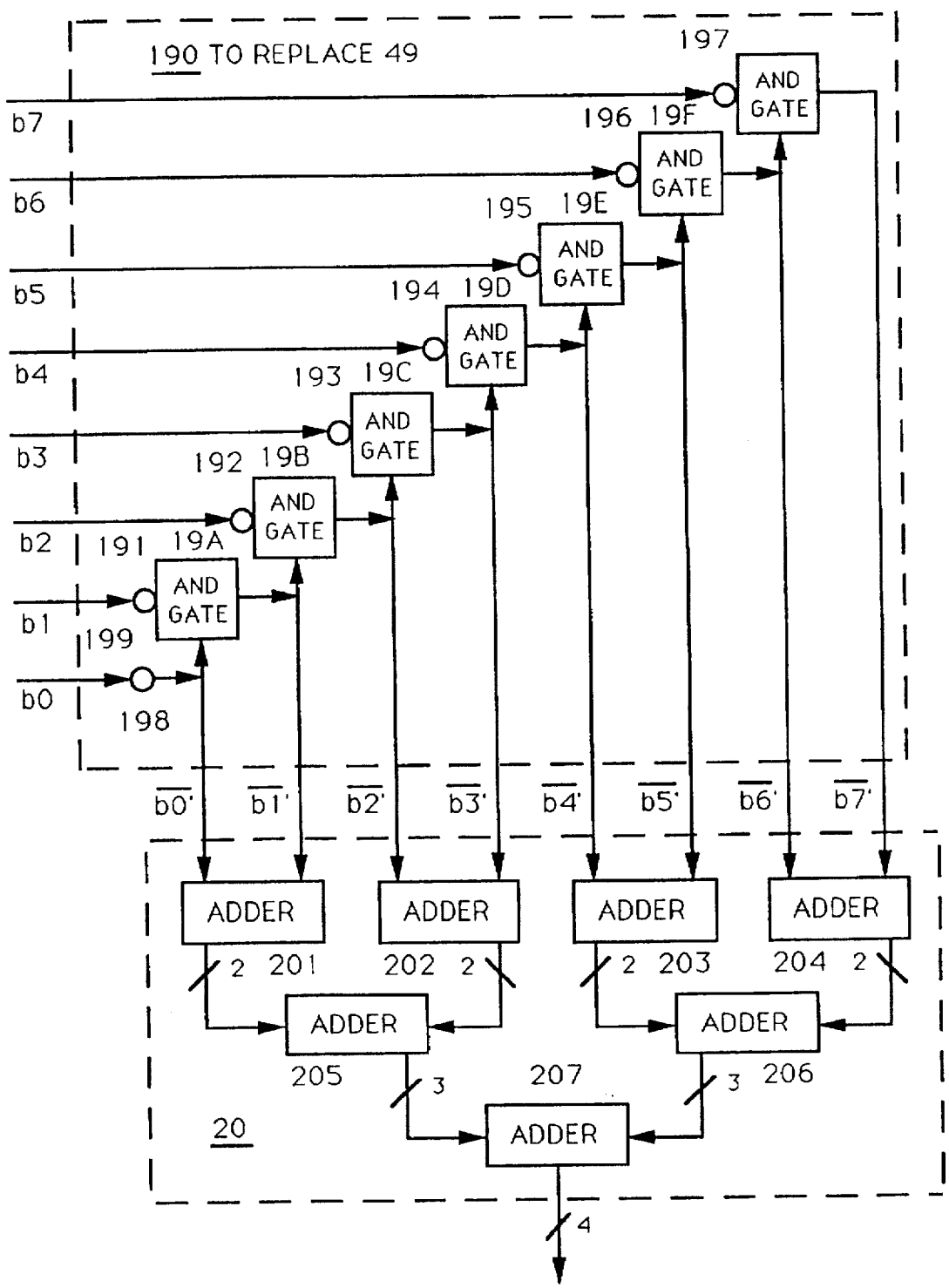
FIG. 7 is a block schematic diagram of a modification that can be made to the FIG. 2 circuitry for use in a decoder for decoding variable-length codes of Huffman type having leading ZEROs, which decoder embodies the invention.

FIG. 7 shows a modification 190 of the FIG. 2 circuitry that accommodates Huffman codes expressed as having pointer codes comprising leading ZEROs, rather than leading ONEs. The bits b0, b1, b2, b3, b4, b5, b6 and b7 are complemented by NOT gates 198, 199, 19A, 19B, 19C, 19D, 19E and 19F before application to adder 201 and the chain of AND gates 191, 192, 193, 194, 195, 196, and 197. This converts the pointer codes with leading ZEROs followed by a ONE to pointer codes with leading ONEs followed by a ZERO. The modification 190 of the FIG. 2 circuitry complements ONEs and leading ZEROs in the Huffman codes having pointer codes comprising leading ZEROs.

Figure 8:
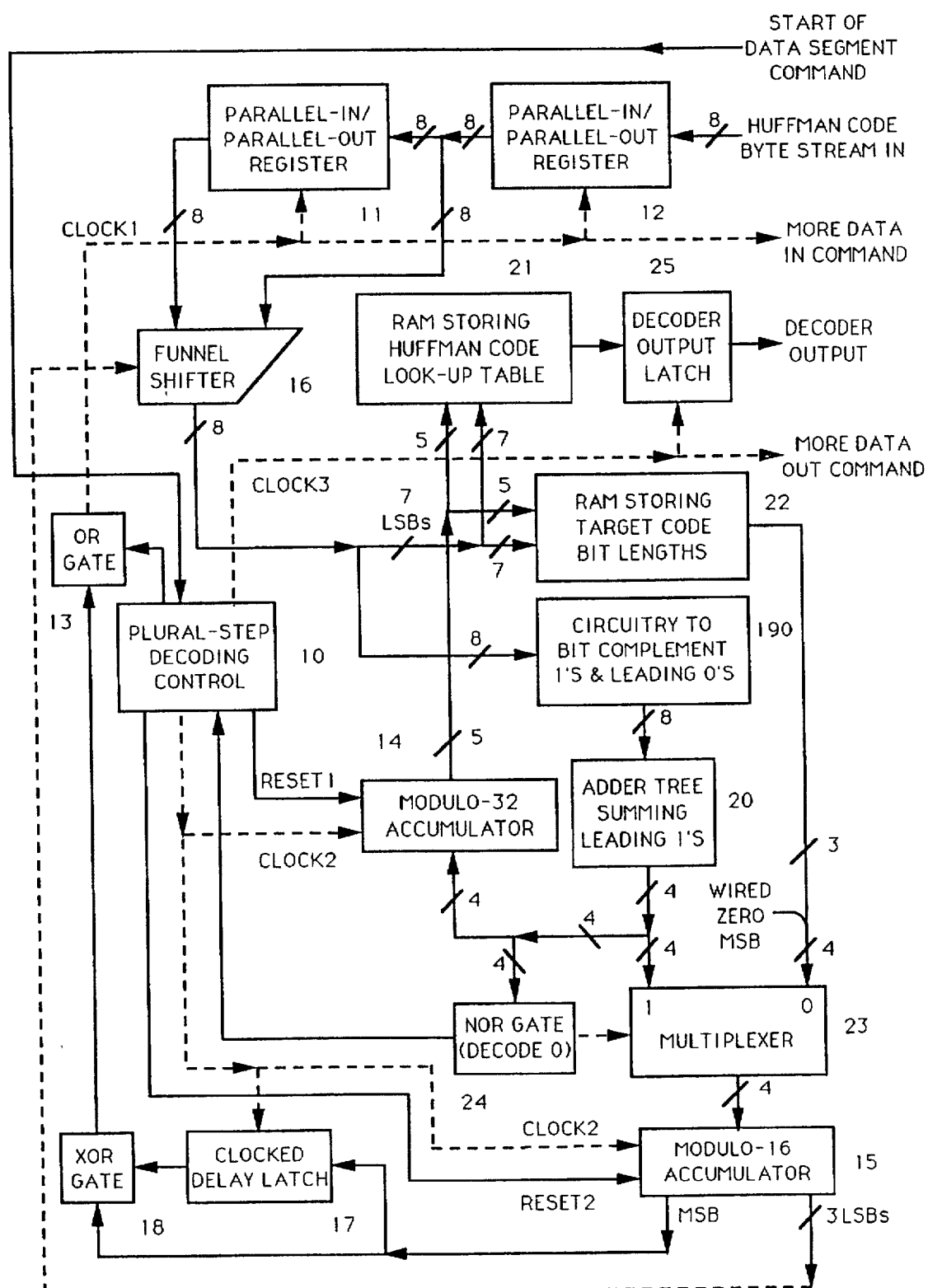
FIGS. 8, 9 and 10 are each a block schematic diagram of a plural-step decoder for variable-length codes of Huffman type having leading ZEROs, which decoder embodies the invention.
Figure 9:
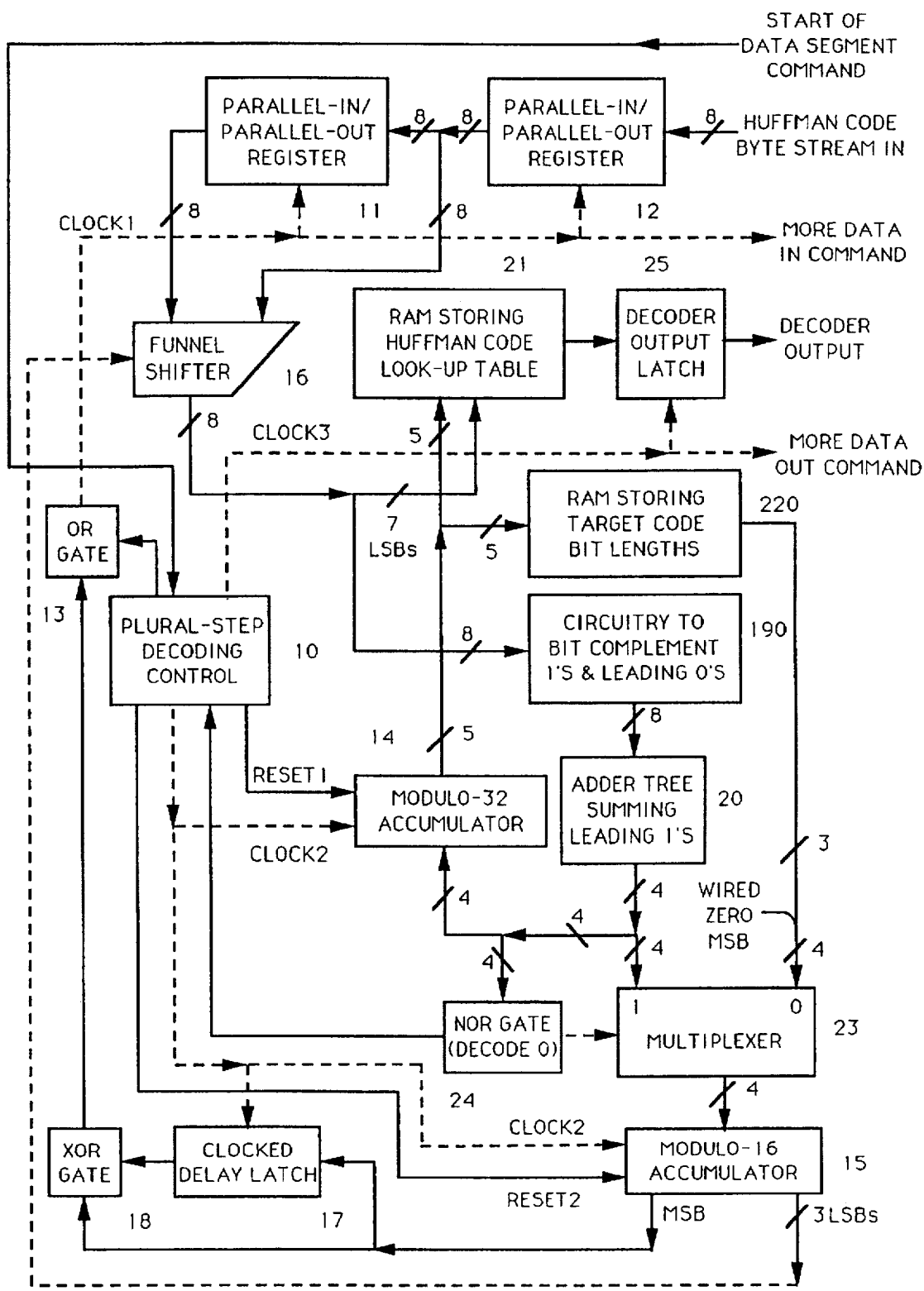
Figure 10:
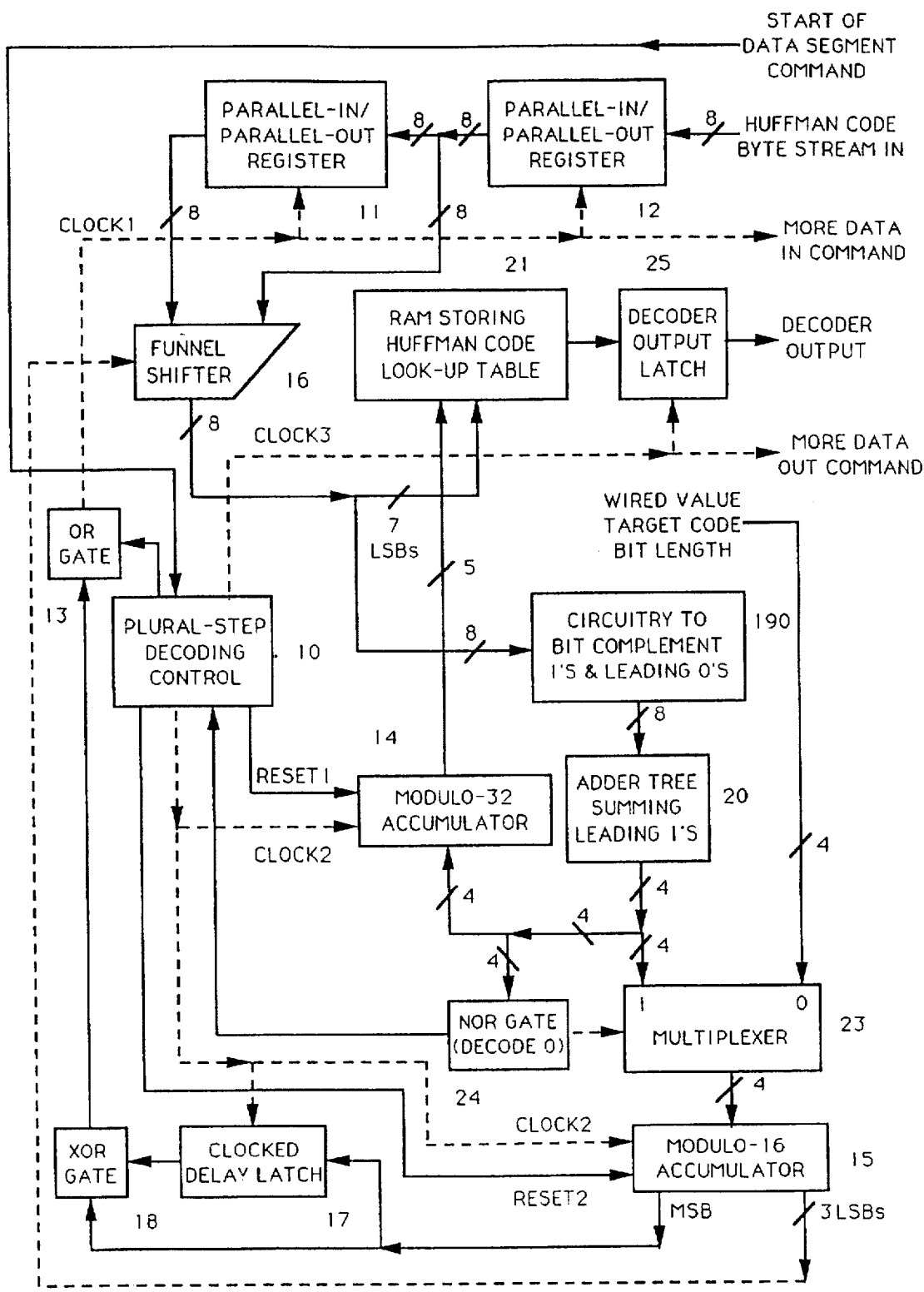

FIGS. 8, 9 and 10 show the decoders that result when the decoders of FIGS. 1, 5 and 6 are respectively modified to replace the circuitry 19 for bit-complementing non-leading ONEs of Huffman codes having pointer codes comprising leading ONEs with circuitry 190 for complementing ONEs and leading ZEROs of Huffman codes having pointer codes comprising leading ZEROs.

The bit-complementing of Huffman codes having leading ZEROs can be carried out prior to the application of their target codes to the RAMs 21 and 22, of course, with the addressing of such memories being modified to suit. Indeed, the bit-complementing of Huffman codes having leading ZEROs need not be done proceeding from the funnel shifter 16 response, but can be carried out before the funnel shifter 16.

The selector circuitry for selecting segments of the Huffman code for analysis according to the precepts of the invention can take a number of forms. If the first-in/first-out memory 35 is constructed as a banked memory so that two addressable storage locations can be simultaneously read from in parallel to the input port of the flannel shifter 16, the parallel-in/parallel-out registers 11 and 12 can be dispensed with, and the MORE DATA IN COMMAND pulse can be used to increment a read address sequencer for the FIFO memory 35. A number of different circuits for supplying two successive bytes of Huffman coding to the funnel shifter 16 are known, such as those employing serial-in/parallel-out registers in which a sequence of serial clocking pulses equal in number to the number of bits in a byte is generated in response to each MORE DATA IN COMMAND pulse. Circuits which employ such serial-in/parallel-out registers, and which apply further sequences of serial clocking pulses equal in number to the binary number indicated by the less significant bits in the output signal of accumulator 15 that keeps track of the number of bits in the data segment as modularly counted, avoid the need for a flannel shifter in still other embodiments of the invention.

The VLC decoders described above can each be modified to use bytes with a bit-width more than eight bits, which will reduce the number of processing steps for longer codewords, will allow longer codewords, and will allow longer target portions in the codewords. The target portions of the codewords are seldom longer than three to five bits; and, since the Huffman code is a statistical code, with longer codewords less likely to occur, decoding rate does not rise quickly with increase in the bit-width of bytes. The principal advantage of increasing byte bit-width is that the range in the number of processing steps for decoding all codewords will be reduced, which can reduce the buffer requirements in the host computer for receiving VLC decoder output. The principal disadvantage of increasing byte bit-width is that the funnel shifter 16 and the registers 11 and 12 supplying it input signal are increased in size.

One skilled in the art and acquainted with the foregoing disclosure will be enabled to design a number of other embodiments of the invention, and the broader claims which follow should be construed to include such variations within their scope.

What is claimed:

1. A decoder for variable-length codewords of Huffman type supplied in a codestream having data segments in which each successive codeword comprises a pointer code segment followed by a target code segment, said decoder comprising:

selection circuitry for successively selecting chunks of the pointer code segment and the target code segment of each successive variable-length codeword, the beginning of the pointer code segment of a first one of said variable-length codewords being determined responsive to a start of data segment command, and the beginning of the pointer code segment of each further one of said variable-length codewords being determined responsive to the accumulated bit-lengths of the complete variable-length codewords processed by the decoder since said start of data segment command, the beginning of the target code segment of each said variable-length codeword being determined with respect to the beginning of the pointer code segment of that same said variable-length codeword by an indication of the bit-length of the pointer code segment of that same said variable-length codeword;

circuitry for generating and temporarily storing first partial memory addresses responsive to respective ones of said pointer code segments as successively selected by said selection circuitry, each said first partial memory address being such as to furnish said indication of the bit-length of the respective one of said pointer codes, each of said first partial memory addresses being temporarily stored while said selection circuitry successively selects the target code segment next after the one of said pointer code segments responsive to which the temporarily stored first partial memory address was generated;

circuitry for generating second partial memory addresses responsive to respective ones of said target codes as successively selected by said selection circuitry;

first memory addressed by said first and second partial addresses for storing look-up tables of decoder output signal;

means for supplying the bit-lengths of just the target code portions of the complete variable-length codewords; and circuitry combining said first partial memory addresses and the bit-lengths of just the target code portions of the complete variable-length codewords for determining the bit-lengths of the complete variable-length codewords.

2. A decoder as set forth in claim 1, wherein said means for supplying the bit-lengths of just the target code portions of the complete variable-length codewords comprises:

second memory addressed by at least portions of said first and second partial addresses for storing the bit-lengths of just the target code portions of the complete variable-length codewords.

3. A decoder as set forth in claim 1, wherein said means for supplying the bit-lengths of just the target code portions of the complete variable-length codewords comprises:

second memory addressed by at least portions of said first partial addresses for storing the bit-lengths of just the target code portions of the complete variable-length codewords.

4. A decoder as set forth in claim 1, wherein said means for supplying the bit-lengths of just the target code portions of the complete variable-length codewords is simply a wired application of a binary number indicative of the bit length of all said target code portions of the complete variable-length codewords.

5. A decoder as set forth in claim 1 for decoding variable-length codewords of Huffman type in which each successive codeword comprises a pointer code segment composed of leading ONEs and a final ZERO, said decoder further comprising:

circuitry for bit-complementing each non-leading ONE in each successively considered portion of the Huffman codestream to generate a unary signal; and an accumulator used for controlling the selection of the portion of the Huffman codestream to be successively considered and processed during each processing step, during each step of processing pointer code accumulating the sums of the bits of the corresponding unary signal, and during each step of processing target code accumulating the bit-length of the target code.

6. A decoder as set forth in claim 5, wherein said selection circuitry comprises a shifting apparatus for shifting the successively considered portions of the Huffman codestream, the shift being controlled by accumulated output signal from said accumulator so said shifting apparatus in selected steps of a plural-step operation justifies the leading bit of the pointer code of each Huffman codeword and justifies the leading bit of the target code of each Huffman codeword.

7. A decoder as set forth in claim 1 for decoding variable-length codewords of Huffman type in which each successive codeword comprises a pointer code segment composed of leading ZEROs and a final ONE, said decoder further comprising:

circuitry for bit-complementing each leading ZERO and each ONE in each successively considered portion of the Huffman codestream to generate a unary signal; and an accumulator used for controlling the selection of the portion of the Huffman codestream to be successively considered and processed during each processing step, during each step of processing pointer code accumulating the sums of the bits of the corresponding unary signal, and during each step of processing target code accumulating the bit-length of the target code.

8. A decoder as set forth in claim 7, wherein said selection circuitry comprises a shifting apparatus for shifting the successively considered portions of the Huffman codestream, the shift being controlled by accumulated output signal from said accumulator so said shifting apparatus in selected steps of a plural-step operation justifies the leading bit of the pointer code of each Huffman codeword and justifies the leading bit of the target code of each Huffman codeword.

9. A decoder for variable-length codewords of Huffman type supplied in a codestream having data segments in which each successive codeword comprises a pointer code segment with leading ONEs and a final ZERO followed by a target code segment, said decoder comprising:

a selector for selecting successive uniform-bit-length portions of said codestream as a selector output signal, selection being in response to a modular count of the bits of a data segment within said codestream, each said uniform-bit-length portion being at least as long as the longest target code segment in any said codeword;

an AND gate chain for complementing non-leading ONEs in each uniform-bit-length portion of the codestream selected by said selector, to generate a respective unary signal;

adder circuitry for summing the bits of each said unary signal to generate a respective sum signal;

a NOR gate responsive to the bits of the current one said sum signals, for detecting when the current one said sum signals is arithmetic zero to generate an indication of a final step in decoding a code word;

a first accumulator for accumulating each said respective sum generated by said adder circuitry to generate a first accumulated output signal, said first accumulated output signal being reset to zero arithmetic value responsive to said first accumulator having a first accumulator reset signal applied thereto;

first memory addressed by said first accumulated output signal and selected bits of said selector output signal, for storing look-up tables of decoder output signal;

second memory for indicating the bit-lengths of just the target code portions of the complete Huffman codes that during the final steps of decoding variable-length code words access decoder output signals stored in said first memory;

a two-input, single-output multiplexer receiving said respective sums generated by said adder circuitry as its first input signal, receiving said binary numbers read from said second memory as its second input signal, and selecting one of its first and second input signals as its output signal responsive to a control signal;

a second accumulator for accumulating output signal from said multiplexer to generate a second accumulated output signal that controls the selecting by said selector, said second accumulated output signal being reset to zero arithmetic value responsive to said second accumulator having a second accumulator reset signal applied thereto;

an output data latch for temporarily storing read-out from said first memory in response to a latching signal; and decoding control circuitry for generating said latching signal during each final step in decoding a code word as signaled by said NOR gate for detecting that the current one said sum signals is arithmetic zero, for generating said first accumulator reset signal at the beginning of each data segment and after each final step in decoding a code word as signaled by said NOR gate for detecting that the current one said sum signals is arithmetic zero, and for generating said second accumulator reset signal at the beginning of each data segment.

10. A decoder as set forth in claim 9, wherein said selector comprises:

means for detecting change in a more significant bit of said second accumulated output signal for generating a clocking signal for N-bit-wide bytes of said codestream;

a first N-bit-wide parallel-in/parallel-out register, having an N-bit-wide input port for receiving an N-bit wide byte of said codestream as clocked thereto in response to said clocking signal, and having an N-bit-wide output port; and a funnel shifter having an N-bit-wide output port, having a 2N-bit-wide input port the leading half of which connects from the input port of said first N-bit-wide parallel-in/parallel-out register and the trailing half of which connects from the output port of said first N-bit-wide parallel-in/parallel-out register, and selecting from its input port to its output port in accordance with a binary-number shift command supplied by less significant bits of said second accumulated output signal, N being a plural integer at least one more than the number of bits in the longest of said target codes.

11. A decoder as set forth in claim 10, wherein said selector further comprises:

a second N-bit-wide parallel-in/parallel-out register, having an N-bit-wide input port for receiving an N-bit wide byte of said codestream as clocked thereto in response to said clocking signal, and having an N-bit-wide output port connected to the input port of said first N-bit-wide parallel-in/parallel-out register.

12. A decoder as set forth in claim 11, wherein said means for detecting change in a more significant bit of said second accumulated output signal for generating a clocking signal comprises:

means for delaying said more significant bit of said second accumulated output signal by one sample time; and an exclusive-OR gate responsive to said more significant bit of said second accumulated output signal and said more significant bit of said second accumulated output signal as delayed by one sample time.

13. A decoder as set forth in claim 10, wherein said means for detecting change in a more significant bit of said second accumulated output signal for generating a clocking signal comprises:

means for delaying said more significant bit of said second accumulated output signal by one sample time; and an exclusive-OR gate responsive to said more significant bit of said second accumulated output signal and said more significant bit of said second accumulated output signal as delayed by one sample time.

14. A decoder as set forth in claim 9, wherein said first and second memories are addressed in parallel, with said second memory addressed by said first accumulated output signal and said selected bits of said selector output signal.

15. A decoder as set forth in claim 14, wherein said selector comprises:

means for detecting change in a more significant bit of said second accumulated output signal for generating a clocking signal for N-bit-wide bytes of said codestream;

a first N-bit-wide parallel-in/parallel-out register, having an N-bit-wide input port for receiving an N-bit wide byte of said codestream as clocked thereto in response to said clocking signal, and having an N-bit-wide output port; and a funnel shifter having an N-bit-wide output port, having a 2N-bit-wide input port the leading half of which connects from the input port of said first N-bit-wide parallel-in/parallel-out register and the trailing half of which connects from the output port of said first N-bit-wide parallel-in/parallel-out register, and selecting from its input port to its output port in accordance with a binary-number shift command supplied by less significant bits of said second accumulated output signal, N being a plural integer at least one more than the number of bits in the longest of said target codes.

16. A decoder as set forth in claim 15, wherein said selector further comprises:

a second N-bit-wide parallel-in/parallel-out register, having an N-bit-wide input port for receiving an N-bit wide byte of said codestream as clocked thereto in response to said clocking signal, and having an N-bit-wide output port connected to the input port of said first N-bit-wide parallel-in/parallel-out register.

17. A decoder as set forth in claim 16, wherein said means for detecting change in a more significant bit of said second accumulated output signal for generating a clocking signal comprises:

means for delaying said more significant bit of said second accumulated output signal by one sample time; and an exclusive-OR gate responsive to said more significant bit of said second accumulated output signal and said more significant bit of said second accumulated output signal as delayed by one sample time.

18. A decoder as set forth in claim 15, wherein said means for detecting change in a more significant bit of said second accumulated output signal for generating a clocking signal comprises:

means for delaying said more significant bit of said second accumulated output signal by one sample time; and an exclusive-OR gate responsive to said more significant bit of said second accumulated output signal and said more significant bit of said second accumulated output signal as delayed by one sample time.

19. A decoder as set forth in clam 9, wherein said second memory is addressed solely by said first accumulated output signal.

20. A decoder as set forth in claim 19, wherein said selector comprises:

means for detecting change in a more significant bit of said second accumulated output signal for generating a clocking signal for N-bit-wide bytes of said codestream;

a first N-bit-wide parallel-in/parallel-out register, having an N-bit-wide input port for receiving an N-bit wide byte of said codestream as clocked thereto in response to said clocking signal, and having an N-bit-wide output port; and a funnel shifter having an N-bit-wide output port, having a 2N-bit-wide input port the leading half of which connects from the input port of said first N-bit-wide parallel-in/parallel-out register and the trailing half of which connects from the output port of said first N-bit-wide parallel-in/parallel-out register, and selecting from its input port to its output port in accordance with a binary-number shift command supplied by less significant bits of said second accumulated output signal, N being a plural integer at least one more than the number of bits in the longest of said target codes.

21. A decoder as set forth in claim 20, wherein said selector further comprises:

a second N-bit-wide parallel-in/parallel-out register, having an N-bit-wide input port for receiving an N-bit wide byte of said codestream as clocked thereto in response to said clocking signal, and having an N-bit-wide output port connected to the input port of said first N-bit-wide parallel-in/parallel-out register.

22. A decoder as set forth in claim 21, wherein said means for detecting change in a more significant bit of said second accumulated output signal for generating a clocking signal comprises:

means for delaying said more significant bit of said second accumulated output signal by one sample time; and an exclusive-OR gate responsive to said more significant bit of said second accumulated output signal and said more significant bit of said second accumulated output signal as delayed by one sample time.

23. A decoder as set forth in claim 20, wherein said means for detecting change in a more significant bit of said second accumulated output signal for generating a clocking signal comprises:

means for delaying said more significant bit of said second accumulated output signal by one sample time; and an exclusive-OR gate responsive to said more significant bit of said second accumulated output signal and said more significant bit of said second accumulated output signal as delayed by one sample time.

24. A decoder for variable-length codewords of Huffman type supplied in a codestream having data segments in which each successive codeword comprises a pointer code segment with leading ZEROs and a final ONE followed by a target code segment, said decoder comprising:

a selector for selecting successive uniform-bit-length portions of said codestream as a selector output signal, selection being in response to a modular count of the bits of a data segment within said codestream, each said uniform-bit-length portion being at least as long as the longest target code segment in any said codeword;

circuitry for bit-complementing each uniform-bit-length portion of the codestream selected by said selector, and an AND gate chain for complementing non-leading ONEs in the resulting signal, to generate a respective unary signal;

adder circuitry for summing the bits of each said unary signal to generate a respective sum signal;

a NOR gate responsive to the bits of the current one said sum signals, for detecting when the current one said sum signals is arithmetic zero to generate an indication of a final step in decoding a code word;

a first accumulator for accumulating each said respective sum generated by said adder circuitry to generate a first accumulated output signal, said first accumulated output signal being reset to zero arithmetic value responsive to said first accumulator having a first accumulator reset signal applied thereto;

first memory addressed by said first accumulated output signal and selected bits of said selector output signal, for storing look-up tables of decoder output signal;

second memory for indicating the bit-lengths of just the target code portions of the complete Huffman codes that during the final steps of decoding variable-length code words access decoder output signals stored in said first memory;

a two-input, single-output multiplexer receiving said respective sums generated by said adder circuitry as its first input signal, receiving said binary numbers read from said second memory as its second input signal, and selecting one of its first and second input signals as its output signal responsive to a control signal;

a second accumulator for accumulating output signal from said multiplexer to generate a second accumulated output signal that controls the selecting by said selector, said second accumulated output signal being reset to zero arithmetic value responsive to said second accumulator having a second accumulator reset signal applied thereto;

an output data latch for temporarily storing read-out from said first memory in response to a latching signal; and decoding control circuitry for generating said latching signal during each final step in decoding a code word as signaled by said NOR gate for detecting that the current one said sum signals is arithmetic zero, for generating said first accumulator reset signal at the beginning of each data segment and after each final step in decoding a code word as signaled by said NOR gate for detecting that the current one said sum signals is arithmetic zero, and for generating said second accumulator reset signal at the beginning of each data segment.

25. A decoder as set forth in claim 24, wherein said selector comprises:

means for detecting change in a more significant bit of said second accumulated output signal for generating a clocking signal for N-bit-wide bytes of said codestream;

a first N-bit-wide parallel-in/parallel-out register, having an N-bit-wide input port for receiving an N-bit wide byte of said codestream as clocked thereto in response to said clocking signal, and having an N-bit-wide output port; and a funnel shifter having an N-bit-wide output port, having a 2N-bit-wide input port the leading half of which connects from the input port of said first N-bit-wide parallel-in/parallel-out register and the trailing half of which connects from the output port of said first N-bit-wide parallel-in/parallel-out register, and selecting from its input port to its output port in accordance with a binary-number shift command supplied by less significant bits of said second accumulated output signal, N being a plural integer at least one more than the number of bits in the longest of said target codes.

26. A decoder as set forth in claim 25, wherein said selector further comprises:

a second N-bit-wide parallel-in/parallel-out register, having an N-bit-wide input port for receiving an N-bit wide byte of said codestream as clocked thereto in response to said clocking signal, and having an N-bit-wide output port connected to the input port of said first N-bit-wide parallel-in/parallel-out register.

27. A decoder as set forth in claim 26, wherein said means for detecting change in a more significant bit of said second accumulated output signal for generating a clocking signal comprises:

means for delaying said more significant bit of said second accumulated output signal by one sample time; and an exclusive-OR gate responsive to said more significant bit of said second accumulated output signal and said more significant bit of said second accumulated output signal as delayed by one sample time.

28. A decoder as set forth in claim 25, wherein said means for detecting change in a more significant bit of said second accumulated output signal for generating a clocking signal comprises:

means for delaying said more significant bit of said second accumulated output signal by one sample time; and an exclusive-OR gate responsive to said more significant bit of said second accumulated output signal and said more significant bit of said second accumulated output signal as delayed by one sample time.

29. A decoder as set forth in claim 24, wherein said first and second memories are addressed in parallel, with said second memory addressed by said first accumulated output signal and said selected bits of said selector output signal.

30. A decoder as set forth in claim 29, wherein said selector comprises:

means for detecting change in a more significant bit of said second accumulated output signal for generating a clocking signal for N-bit-wide bytes of said codestream;

a first N-bit-wide parallel-in/parallel-out register, having an N-bit-wide input port for receiving an N-bit wide byte of said codestream as clocked thereto in response to said clocking signal, and having an N-bit-wide output port; and a funnel shifter having an N-bit-wide output port, having a 2N-bit-wide input port the leading half of which connects from the input port of said first N-bit-wide parallel-in/parallel-out register and the trailing half of which connects from the output port of said first N-bit-wide parallel-in/parallel-out register, and selecting from its input port to its output port in accordance with a binary-number shift command supplied by less significant bits of said second accumulated output signal, N being a plural integer at least one more than the number of bits in the longest of said target codes.

31. A decoder as set forth in claim 30, wherein said selector further comprises:

a second N-bit-wide parallel-in/parallel-out register, having an N-bit-wide input port for receiving an N-bit wide byte of said codestream as clocked thereto in response to said clocking signal, and having an N-bit-wide output port connected to the input port of said first N-bit-wide parallel-in/parallel-out register.

32. A decoder as set forth in claim 31, wherein said means for detecting change in a more significant bit of said second accumulated output signal for generating a clocking signal comprises:

means for delaying said more significant bit of said second accumulated output signal by one sample time; and an exclusive-OR gate responsive to said more significant bit of said second accumulated output signal and said more significant bit of said second accumulated output signal as delayed by one sample time.

33. A decoder as set forth in claim 30, wherein said means for detecting change in a more significant bit of said second accumulated output signal for generating a clocking signal comprises:

means for delaying said more significant bit of said second accumulated output signal by one sample time; and an exclusive-OR gate responsive to said more significant bit of said second accumulated output signal and said more significant bit of said second accumulated output signal as delayed by one sample time.

34. A decoder as set forth in claim 24, wherein said second memory is addressed solely by said first accumulated output signal.

35. A decoder as set forth in claim 34, wherein said selector comprises:

means for detecting change in a more significant bit of said second accumulated output signal for generating a clocking signal for N-bit-wide bytes of said codestream;

a first N-bit-wide parallel-in/parallel-out register, having an N-bit-wide input port for receiving an N-bit wide byte of said codestream as clocked thereto in response to said clocking signal, and having an N-bit-wide output port; and a funnel shifter having an N-bit-wide output port, having a 2N-bit-wide input port the leading half of which connects from the input port of said first N-bit-wide parallel-in/parallel-out register and the trailing half of which connects from the output port of said first N-bit-wide parallel-in/parallel-out register, and selecting from its input port to its output port in accordance with a binary-number shift command supplied by less significant bits of said second accumulated output signal, N being a plural integer at least one more than the number of bits in the longest of said target codes.

36. A decoder as set forth in claim 35, wherein said selector further comprises:

a second N-bit-wide parallel-in/parallel-out register, having an N-bit-wide input port for receiving an N-bit wide byte of said codestream as clocked thereto in response to said clocking signal, and having an N-bit-wide output port connected to the input port of said first N-bit-wide parallel-in/parallel-out register.

37. A decoder as set forth in claim 36, wherein said means for detecting change in a more significant bit of said second accumulated output signal for generating a clocking signal comprises:

means for delaying said more significant bit of said second accumulated output signal by one sample time; and an exclusive-OR gate responsive to said more significant bit of said second accumulated output signal and said more significant bit of said second accumulated output signal as delayed by one sample time.

38. A decoder as set forth in claim 35, wherein said means for detecting change in a more significant bit of said second accumulated output signal for generating a clocking signal comprises:

means for delaying said more significant bit of said second accumulated output signal by one sample time; and an exclusive-OR gate responsive to said more significant bit of said second accumulated output signal and said more significant bit of said second accumulated output signal as delayed by one sample time.

* * * * *